US010332984B2

(12) United States Patent
Choi et al.

(10) Patent No.: US 10,332,984 B2
(45) Date of Patent: Jun. 25, 2019

(54) SEMICONDUCTOR DEVICES HAVING REDUCED CONTACT RESISTANCE

(71) Applicant: Samsung Electronics Co., Ltd., Suwon-si, Gyeonggi-do (KR)

(72) Inventors: Hyo Seok Choi, Hwaseong-si (KR); Ryuji Tomita, Yongin-si (KR); Joon Gon Lee, Seoul (KR); Chul Sung Kim, Seongnam-si (KR); Jae Eun Lee, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/473,143

(22) Filed: Mar. 29, 2017

(65) Prior Publication Data

US 2018/0090583 A1    Mar. 29, 2018

(30) Foreign Application Priority Data

Sep. 28, 2016  (KR) ......................... 10-2016-0124959

(51) Int. Cl.
*H01L 29/78* (2006.01)
*H01L 29/66* (2006.01)
(Continued)

(52) U.S. Cl.
CPC .. *H01L 29/66795* (2013.01); *H01L 21/76897* (2013.01); *H01L 21/823821* (2013.01); *H01L 23/535* (2013.01); *H01L 27/0924* (2013.01); *H01L 29/401* (2013.01); *H01L 29/41791* (2013.01); *H01L 29/665* (2013.01);
(Continued)

(58) Field of Classification Search
CPC ................ H01L 29/45; H01L 29/7851; H01L 29/66795; H01L 29/0847; H01L 23/535; H01L 29/66545; H01L 29/41791; H01L 29/0649; H01L 21/76897
See application file for complete search history.

(56) References Cited

U.S. PATENT DOCUMENTS 6,828,199 B2    12/2004   Ogura et al.
7,799,682 B2     9/2010   Beyer et al.
(Continued)

FOREIGN PATENT DOCUMENTS

JP              2894345         3/1999
KR       1020020034307 A        5/2002
(Continued)

*Primary Examiner* — Moin M Rahman
(74) *Attorney, Agent, or Firm* — Myers Bigel, P.A.

(57) ABSTRACT

A semiconductor device includes a substrate including an active region, a gate structure, source/drain regions, ones of the source/drain regions having an upper surface in which a recessed region is formed, a contact plug on the source/drain regions and extending in a direction substantially perpendicular to an upper surface of the substrate from an interior of the recessed region, a metal silicide film on an internal surface of the recessed region and including a first portion between a bottom surface of the recessed region and a lower surface of the contact plug and a second portion between a side wall of the recessed region and a side surface of the contact plug, and a metal layer connected to an upper portion of the metal silicide film and on a side surface of a region of the contact plug.

7 Claims, 31 Drawing Sheets

(51) Int. Cl.
    *H01L 23/535*      (2006.01)
    *H01L 29/417*      (2006.01)
    *H01L 21/768*      (2006.01)
    *H01L 21/8238*     (2006.01)
    *H01L 27/092*      (2006.01)
    *H01L 29/40*       (2006.01)
    *H01L 21/84*       (2006.01)
    *H01L 27/12*       (2006.01)

(52) U.S. Cl.
    CPC .......... *H01L 29/785* (2013.01); *H01L 21/845* (2013.01); *H01L 27/1211* (2013.01); *H01L 29/66545* (2013.01)

(56) References Cited

U.S. PATENT DOCUMENTS

| | | |
|---|---|---|
| 8,575,023 B2 | 11/2013 | Ohmi et al. |
| 8,643,122 B2 | 2/2014 | Alptekin et al. |
| 9,337,337 B2 | 5/2016 | Kwok et al. |
| 2005/0001252 A1* | 1/2005 | Kim ................ H01L 21/823437 257/296 |
| 2007/0181954 A1 | 8/2007 | Oikawa |
| 2013/0119483 A1* | 5/2013 | Alptekin ............. H01L 29/7833 257/408 |
| 2016/0211251 A1* | 7/2016 | Liaw .................. H01L 27/0207 |
| 2016/0233164 A1* | 8/2016 | Choi .................. H01L 27/0924 |

FOREIGN PATENT DOCUMENTS

| KR | 1020040058951 | 7/2004 |
|---|---|---|
| KR | 100431309 B1 | 8/2004 |

* cited by examiner

SEMICONDUCTOR DEVICES HAVING REDUCED CONTACT RESISTANCE

CROSS-REFERENCE TO RELATED APPLICATION

This U.S. non-provisional patent application claims priority under 35 U.S.C. § 119 to Korean Patent Application No. 10-2016-0124959 filed on Sep. 28, 2016, in the Korean Intellectual Property Office, the entire content of which is incorporated herein by reference.

BACKGROUND

1. Field

The present inventive concepts relate to semiconductor devices and to methods of manufacturing semiconductor devices.

2. Description of Related Art

Due to an increase in demand for high-performance, high-speed semiconductor devices and/or multifunctional semiconductor devices, a degree of integration in semiconductor devices has increased. In order to manufacture semiconductor devices having a fine pattern in response to the increased integration in semiconductor devices, patterns having relatively narrow widths or short separation distances are desired. In order to overcome the limitations of planar metal oxide semiconductor FETs (MOSFETs), semiconductor devices including fin field effect transistors (FinFETs) on which a channel having a three dimensional structure is mounted have been developed.

According to reductions in the size thereof, contact resistance between source/drain regions and contact plugs connected to source/drain regions may affect the characteristics of devices due to parasitic resistance of the semiconductor devices

SUMMARY

Some example embodiments of the present inventive concepts provide semiconductor devices having reduced contact resistance with respect to a contact plug.

Some example embodiments provide methods of manufacturing semiconductor devices having reduced contact resistance with respect to a contact plug.

According to an example embodiment, semiconductor devices may include a substrate including an active region; a gate structure on the active region; source/drain regions in the active region, on opposing sides of the gate structure, ones of the source/drain regions having an upper surface in which a recessed region is formed; a contact plug on the source/drain regions and extending in a direction substantially perpendicular to an upper surface of the substrate from the recessed region; a metal silicide film on a surface of the recessed region and including a first portion between a bottom surface of the recessed region and a lower surface of the contact plug and a second portion connected to the first portion and between a side wall of the recessed region and a side surface of the contact plug; and a metal layer connected to an upper portion of the metal silicide film and on the side surface of the contact plug.

According to an example embodiment, semiconductor devices may include a substrate including an active region; an insulating layer on the substrate and including a contact hole that extends to the active region; a contact plug in the contact hole and including a tip region in the active region; a metal silicide film on the active region and adjacent the tip region of the contact plug; a metal layer connected to an upper portion of the metal silicide film and on a side wall of the contact hole; and a conductive barrier film on a surface of the contact plug at an interface between the metal silicide film and the metal layer.

According to an example embodiment, semiconductor devices may include a substrate, an active region in the substrate, a source/drain region in the active region, a contact plug on the source/drain region, the contact plug having a lower portion within the recessed region of the source/drain region, a metal silicide film between a sidewall of the recessed region and the lower portion of the contact plug, and a metal layer on the metal silicide film and adjacent the contact plug. The source/drain region may include a recessed region having a lower surface that is closer to the substrate than an upper surface of the source/drain region. The metal silicide film may be between the metal layer and the substrate. The metal layer may include a same metal as the metal silicide film.

BRIEF DESCRIPTION OF DRAWINGS

The above and other aspects, features and other advantages of the present inventive concepts will be more clearly understood from the following detailed description when taken in conjunction with the accompanying drawings, in which.

DETAILED DESCRIPTION

Hereinafter, embodiments of the present inventive concepts will be described as follows with reference to the attached drawings.

Figure 1:
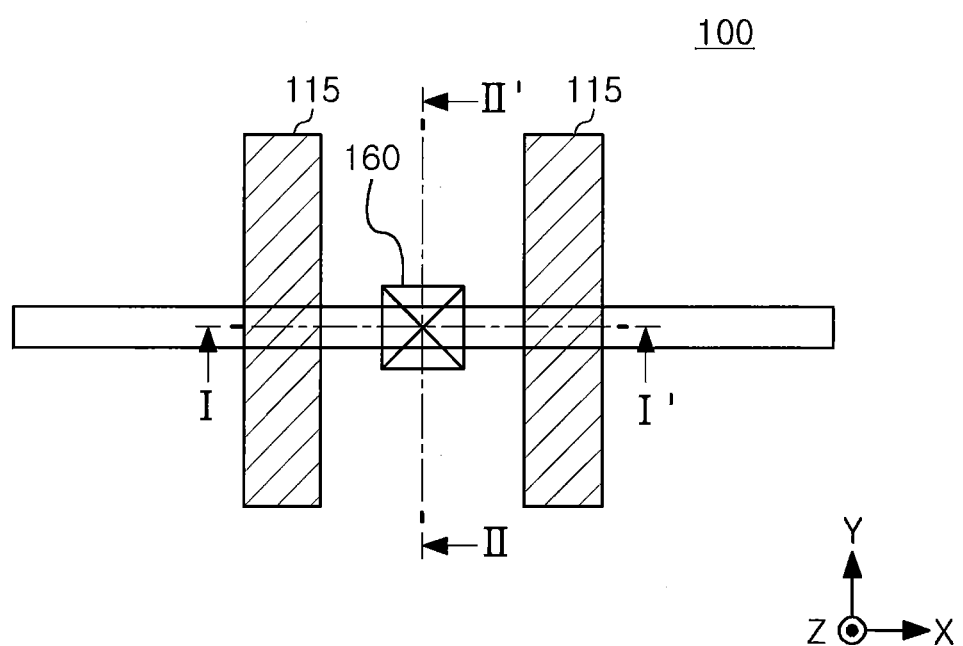
FIG. 1 is a layout of a semiconductor device according to an example embodiment of the present inventive concepts.
Figure 2A:
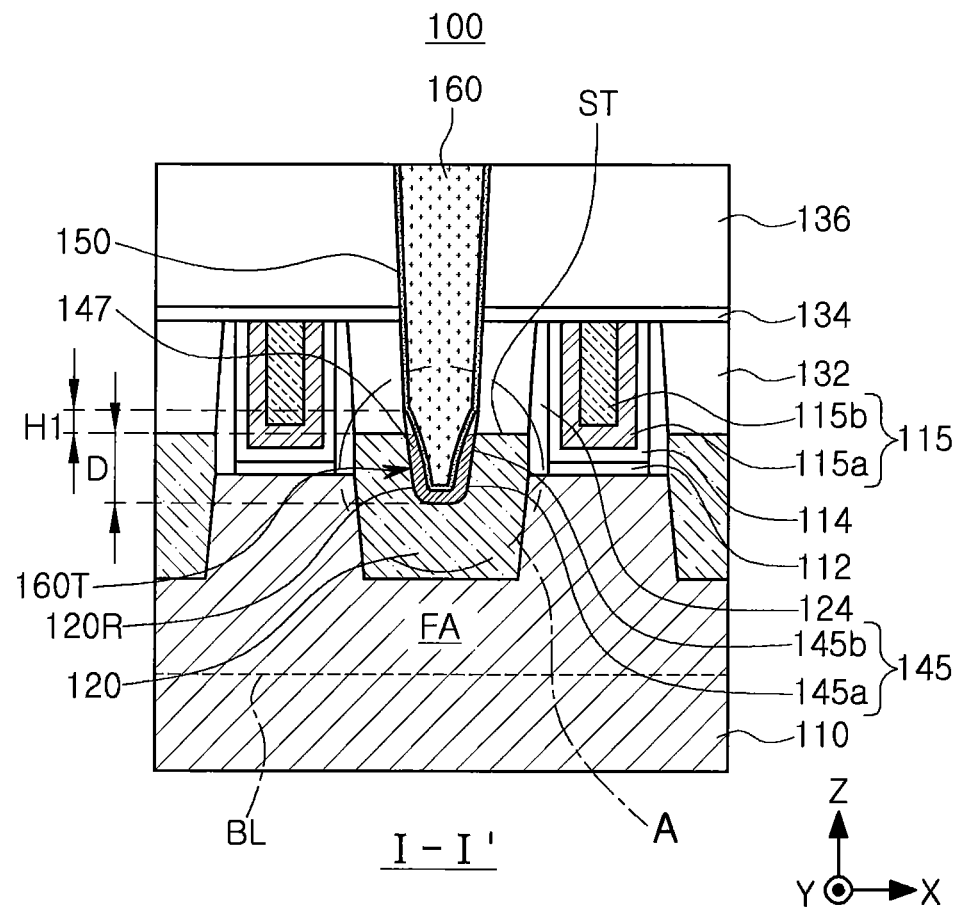
FIG. 2A is a cross-sectional view taken along line I-I' of the semiconductor device of FIG. 1.
Figure 2B:
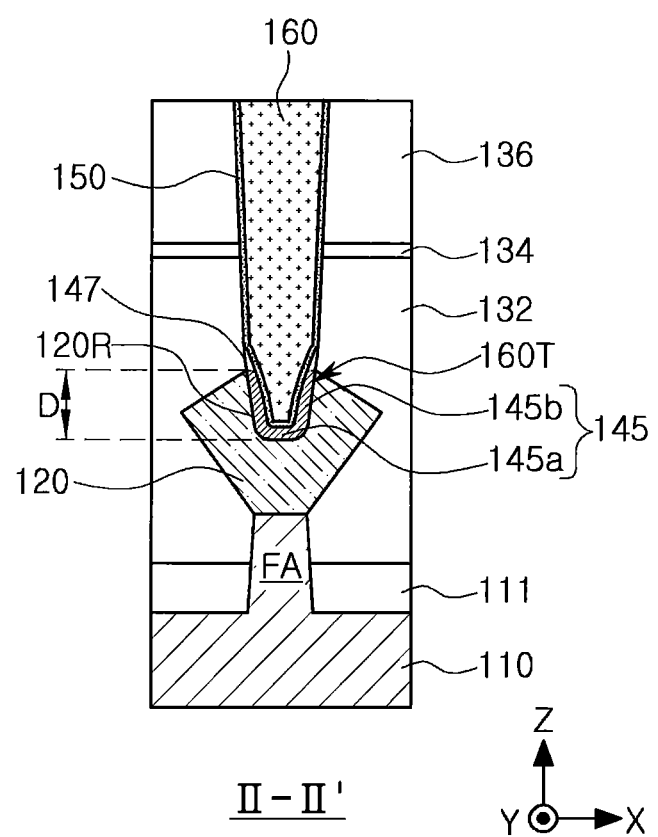
FIG. 2B is a cross-sectional view taken along line II-II' of the semiconductor device of FIG. 1.
Figure 2C:
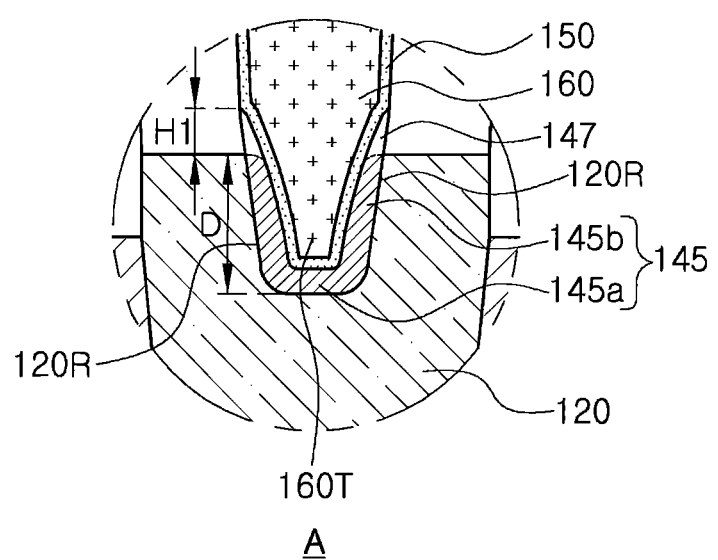
FIG. 2C is a partially enlarged view of a portion 'A' of the semiconductor device of FIG. 2A.
Figure 3:
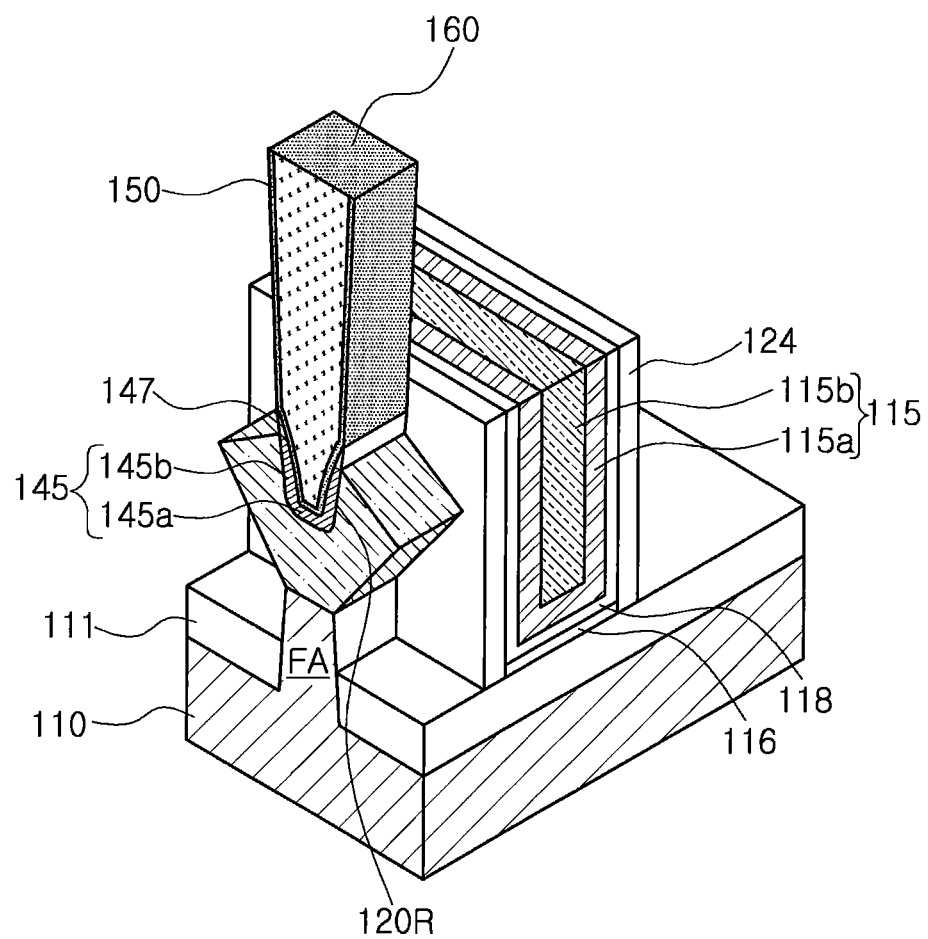
FIG. 3 is a perspective view of main components of the semiconductor device illustrated in FIGS. 2A and 2B.

FIG. 1 is a layout of a semiconductor device according to an example embodiment of the present inventive concepts, while FIGS. 2A and 2B are cross-sectional views taken along line I-I' and II-II' of the semiconductor device of FIG. 1, respectively. FIG. 2C is a partially enlarged view of a portion 'A' of the semiconductor device of FIG. 2A. FIG. 3 is a perspective view of main components of the semiconductor device illustrated in FIGS. 2A and 2B With reference to FIGS. 2A, 2B, 2C and 3 along with FIG. 1, a semiconductor device 100 may include a substrate 110 having a fin-type active region FA.

The substrate 110 may include a semiconductor, such as silicon (Si) or germanium (Ge), or a compound semiconductor, such as, for example, silicon germanium (SiGe), silicon carbide (SiC), gallium arsenide (GaAs), indium arsenide (InAs), and indium phosphide (InP). In some embodiments, the substrate 110 may have a silicon on insulator (SOI) structure. The substrate 110 may include a conductive region, such as a well doped with an impurity and/or a structure doped with an impurity.

A side wall in a lower portion of the fin-type active region FA may be covered with a device isolation film 111 on the substrate 110. In addition, the fin-type active region FA may protrude to have a fin-type structure beyond an upper portion of the device isolation film 111, in a direction (e.g., Z direction) perpendicular to a main surface (X-Y plane) of the substrate 110. The fin-type active region FA may be extended in a first direction (e.g., X direction). A level of a bottom surface of the fm-type active region FA may be marked by a broken line BL in FIG. 2A.

As illustrated in FIGS. 2A and 2B, the semiconductor device 100 may include source/drain regions 120. The source/drain regions 120 may have a raised source/drain (RSD) structure in which a level of an upper surface ST of the source/drain regions 120 may be higher than that of an upper surface of the fin-type active region FA. As used herein, an upper surface of an element may be a surface that is farthest from the substrate 110 than other surfaces of the element. The lower surface may be a surface that is closest to the substrate 110 than other surfaces of the element. As illustrated in FIG. 2B, the source/drain regions 120 may have a pentagonal shape, but are not limited thereto. In some embodiments, the source/drain regions 120 may have various shapes. For example, the source/drain regions 120 may have, for example, a polygonal shape, a circular shape, or a rectangular shape. In some embodiments, the source/drain regions 120 may be formed to have a structure in which the source/drain regions 120 are merged and/or connected on a plurality of fm-type active regions FA (e.g., three fin-type active regions FA).

A plurality of interface films 112, a plurality of gate insulating films 114, and a plurality of gate lines 115 may be disposed on the fin-type active region FA. The plurality of gate insulating films 114 and the plurality of gate lines 115 may be on an upper surface and opposing side walls of each of the plurality of fin-type active regions FA and an upper surface of the device isolation film 111, and may be extended in a second direction (e.g., Y direction) crossing the first direction (e.g., X direction). A plurality of metal oxide semiconductor (MOS) transistors may be formed in a region in which the fin-type active region FA intersects the plurality of gate lines 115. The plurality of MOS transistors may have a three-dimensional structure in which a channel is formed on the upper surface and the opposing side walls of each of the plurality of fin-type active regions FA.

Opposing side walls of each of the plurality of interface films 112, the plurality of gate insulating films 114, and the plurality of gate lines 115 may be covered with an insulating spacer 124. The plurality of interface films 112 may be formed in such a manner that an exposed surface of each of the plurality of fin-type active regions FA is oxidized. The plurality of interface films 112 may prevent or reduce an interface defect between the fin-type active region FA and the gate insulating film 114 from occurring.

In some embodiments, the plurality of interface films 112 may be formed using a low dielectric material layer having a low dielectric constant (e.g., 9 or less), for example, a silicon oxide layer, a silicon oxynitride layer, or combinations thereof. In some embodiments, the plurality of interface films 112 may be formed using a silicate or combinations of a silicate and the low dielectric materials described above.

The plurality of gate insulating films 114 may be formed using a silicon oxide layer, a high dielectric film, or a combination thereof. The high dielectric film may include a material having a dielectric constant higher than that of a silicon oxide layer (e.g., about 10 to about 25). For example, the high dielectric film may be formed using a material selected from a hafnium oxide, a hafnium oxynitride, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, lead zinc niobate, and combinations thereof, but is not limited thereto. The gate insulating film 114 may be formed using a process of atomic layer deposition (ALD), chemical vapor deposition (CVD), or physical vapor deposition (PVD).

The plurality of gate lines 115 may include a first gate electrode 115a and a second gate electrode 115b. The first gate electrode 115a may control a work function. The second gate electrode 115b may fill space formed on the first gate electrode 115a. The first gate electrode 115a may be a diffusion blocking layer of the second gate electrode 115b, but is not limited thereto.

The first gate electrode 115a and the second gate electrode 115b may be formed using different materials. For example, the first gate electrode 115a may include a metallic nitride, such as a titanium nitride (TiN) layer, a tantalum nitride (TaN) layer, and/or a tungsten nitride (WN) layer. For example, the second gate electrode 115b may include a metal material, such as, for example, aluminum (Al), tungsten (W), and/or molybdenum (Mo), or may include a semiconductor material, such as, for example, doped polysilicon.

The source/drain regions 120 may be disposed on a side of a gate line 115 in the fin-type active region FA. The source/drain regions 120 may include a semiconductor layer epitaxially grown from the fm-type active region FA. The source/drain regions 120 may have the upper surface ST in which a recessed region 120R is formed. The recessed region 120R may be formed to have a depth D so that a portion of a contact plug 160 may be disposed in the recessed region 120R.

In some embodiments, the source/drain regions 120 may have an embedded SiGe structure in which a plurality of selectively epitaxially grown SiGe layers are included. The plurality of SiGe layers may have different Ge contents. In some embodiments, the source/drain regions 120 may be formed using an epitaxially grown Si layer or an epitaxially grown SiC layer.

An intergate insulating film 132 may be formed between the plurality of gate lines 115. The intergate insulating film 132 may be formed between two gate lines 115 disposed adjacent each other, in order to cover the source/drain regions 120. The intergate insulating film 132 may be formed using a silicon oxide layer, but is not limited thereto.

A blocking insulating film 134 may be formed on the plurality of gate lines 115 and the intergate insulating film 132. The blocking insulating film 134 may prevent or reduce an undesired foreign substance, such as oxygen (O), from infiltrating into the plurality of gate lines 115. In addition, the blocking insulating film 134 may prevent or reduce an undesired phenomenon in which a threshold voltage is changed in the gate line 115, or a short circuit occurs between the gate line 115 and the contact plug 160. For example, the blocking insulating film 134 may be formed using a silicon nitride ($Si_3N_4$) layer, a silicon oxynitride (SiON) layer, a carbon-containing silicon oxynitride (SiCON) layer or combinations thereof. In some embodiments, the blocking insulating film 134 may be about 20 Å to about 50 Å in thickness.

An interlayer insulating film 136 may be formed on the blocking insulating film 134. The interlayer insulating film 136 may be formed using a silicon oxide layer, but is not limited thereto. In some embodiments, at least one of the intergate insulating film 132 and the interlayer insulating film 136 may be formed using a tetraethyl orthosilicate (TEOS) film. In some embodiments, at least one of the intergate insulating film 132 and the interlayer insulating film 136 may be provided as an ultra low K (ULK) film having an ultra low dielectric constant (e.g., about 2.2 to about 2.4) film, for example, a film selected from a silicon oxycarbide (SiOC) film and a hydrogenated oxidized silicon carbon (SiCOH) film.

The contact plug 160 may be disposed on the source/drain regions 120, in order to be electrically connected to the source/drain regions 120. The contact plug 160 may extend in a third direction (e.g. Z direction) perpendicular to an upper surface (X-Y plane) of the substrate 110 from an interior of the recessed region 120R. In detail, the contact plug 160 may have a cross-sectional shape (e.g., on an X-Y plane) such as a circular shape, an ovular shape, or a polygonal shape, however the present inventive concepts are not limited thereto.

The contact plug 160 may penetrate through the interlayer insulating film 136, the blocking insulating film 134, and the intergate insulating film 132. In some embodiments, the contact plug 160 may be fully or partially surrounded with the intergate insulating film 132, the blocking insulating film 134, and the interlayer insulating film 136, and may be isolated from other conductive layers. In detail, the contact plug 160 may be formed using W, copper (Cu), Al, alloys thereof, or combinations thereof. As illustrated in FIGS. 2A and 2B, the contact plug 160 may include a tip region 160T disposed in the recessed region 120R. A metal silicide film 145 may be formed on a side wall of the recessed region 120R and interposed between the source/drain regions 120 and the contact plug 160 (or a conductive barrier film 150, described herein).

In some embodiments, the metal silicide film 145 may include a first portion 145a disposed on a bottom surface of the recessed region 120R, and may include a second portion 145b connected to the first portion 145a to be integrated therewith and disposed on a side wall of the recessed region 120R. In addition, the first portion 145a of the metal silicide film 145 may be disposed on a lower surface of the contact plug 160, while the second portion 145b of the metal silicide film 145 may be disposed on a side surface of a portion of the contact plug 160. As such, a surface of the tip region 160T of the contact plug 160 may be substantially surrounded by the metal silicide film 145. In some embodiments, a thickness of the second portion 145b of the metal silicide film 145 may be gradually thinner in a direction away from the first portion 145a.

The semiconductor device 100, according to some embodiments of the inventive concepts, may include the metal silicide film 145 on the bottom surface and the side wall of the recessed region 120R formed in the source/drain regions 120. The metal silicide film 145 may have a relatively large contact area with respect to the contact plug 160, thus reducing a level of contact resistance between the source/drain regions 120 and the contact plug 160.

Since the metal silicide film 145 may be formed by reacting with a semiconductor material (e.g., Si, SiGe, Ge, or the like) of the source/drain regions 120, the metal silicide film 145 may be formed up to the upper surface ST of the source/drain regions 120. In some embodiments, an upper surface of the metal silicide film 145 may be substantially coplanar with the upper surface ST of the source/drain regions 120. In some embodiments, an upper surface of the metal silicide film 145 may be below the upper surface ST of the source/drain regions 120. In some embodiments, the metal silicide film 145 may have a composition represented by $MSi_xD_y$. In the composition, M may be provided as a metal, and D may be provided as an element having a component different from M and Si. In addition, the composition may satisfy $0<x\leq3$ and $0\leq y\leq1$. M may be provided, for example, as titanium (Ti), cobalt (Co), nickel (Ni), tantalum (Ta), platinum (Pt), or combinations thereof, while D may be provided, for example, as Ge, C, argon (Ar), krypton (Kr), xenon (Xe) or combinations thereof. For example, the metal silicide film 145 may be provided as titanium silicide.

In some embodiments, a metal layer 147 may be disposed on the metal silicide film 145. The metal layer 147 may protrude from the recessed region 120R, and may be formed on a side wall of a contact hole to have a specific height H1. In other words, in some embodiments, the metal layer 147 may protrude from the recessed region 120R (e.g., in a Z direction) by height H1. As illustrated in FIG. 2C, the metal layer 147 may be disposed on a level higher (e.g. further from the substrate 110) than that of the upper surface ST of the source/drain regions 120. The metal layer 147 may include a metal that is substantially the same as a metal included in the metal silicide film 145. In some embodiments, the metal layer 147 may include at least one metal selected from a group consisting of Ti, Co, Ni, Ta, and Pt. For example, in a case in which the metal silicide film 145 is provided as titanium silicide, the metal layer 147 may be provided as Ti.

In some embodiments, a lower surface and a side wall of the contact plug 160 may be partially or fully surrounded with the conductive barrier film 150. The conductive barrier film 150 may include a lower region in contact with the metal silicide film 145 and/or the metal layer 147, and an upper region surrounding the side wall of the contact plug 160. The metal silicide film 145 may be electrically connected to the contact plug 160 by the lower region of the conductive barrier film 150. In other words, the conductive barrier film 150 may be disposed at an interface between the contact plug 160 and the metal silicide film 145 and an interface between the contact plug 160 and the metal layer 147.

The conductive barrier film 150 may be formed using a metal nitride layer. For example, the conductive barrier film 150 may be formed using TiN, TaN, aluminum nitride (AlN), WN, or combinations thereof.

The first portion 145a of the metal silicide film 145 may be disposed on a level higher (e.g., farther from the substrate 110) than that of a lowermost surface of the gate lines 115 (see FIG. 3) and lower (e.g., closer to the substrate 110) than that of the upper surface of the fin-type active region FA (see FIG. 2A). In other words, the first portion 145a of the metal silicide film 145 may be disposed on a level between the lowermost surface of the gate lines 115 and the upper surface of the fin-type active region FA. The metal layer 147 may be disposed on the metal silicide film 145 to be integrated therewith, and may be disposed on a level higher than that of the upper surface ST of the source/drain regions 120. The metal layer 147 may include a metal itself and/or a metal that is not sufficiently silicided (e.g., a silicon content of 30 at % or less).

FIGS. 4A to 15B are cross-sectional views illustrating methods of manufacturing semiconductor devices according to example embodiments of the present inventive concepts. The cross-sectional view of FIGS. 4A to 15B include a cross-sectional view taken along lines I-I' and II-II', corresponding to the cross-sectional views illustrated in FIGS. 2A and 2B.

Figure 4A:
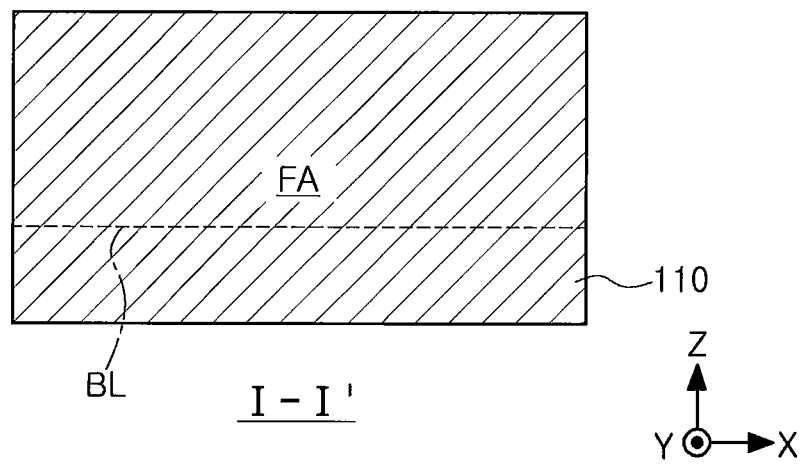
FIGS. 4A to 15B are cross-sectional views illustrating methods of manufacturing semiconductor devices according to example embodiments of the present inventive concepts.
Figure 4B:
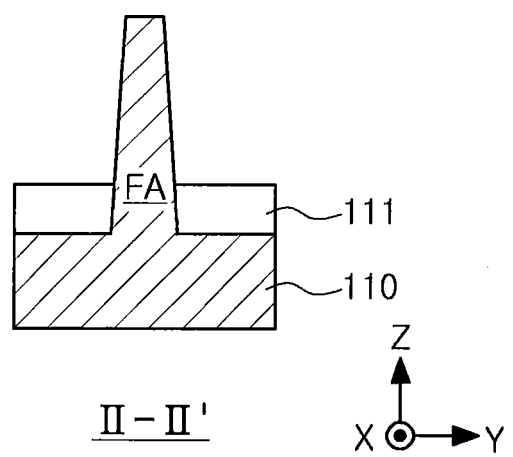

With reference to FIGS. 4A and 4B, a substrate 110 including a fin-type active region FA may be provided.

The fin-type active region FA may be formed in such a manner that a region of the substrate 110 is selectively etched. The fin-type active region FA may protrude beyond an upper portion of the substrate 110 (e.g., Z direction) from a main surface (e.g., X-Y plane) thereof, and may be extended in a direction (e.g., X direction). For example, the substrate 110 may have a P-MOSFET region and/or an N-MOSFET region. In addition, the fin-type active region FA may include a p-type impurity diffusion region or an n-type impurity diffusion region, according to a desired channel type of an MOSFET.

Subsequently, an insulating film covering the fin-type active region FA may be formed on the substrate 110, and the insulating film may be etched back to allow a portion of the fin-type active region FA to be exposed, thus forming a device isolation film 111, as illustrated in FIG. 4B. The device isolation film 111 may be formed using, for example, a silicon oxide layer, a silicon nitride layer, a silicon oxynitride layer or combinations thereof.

Figure 5A:
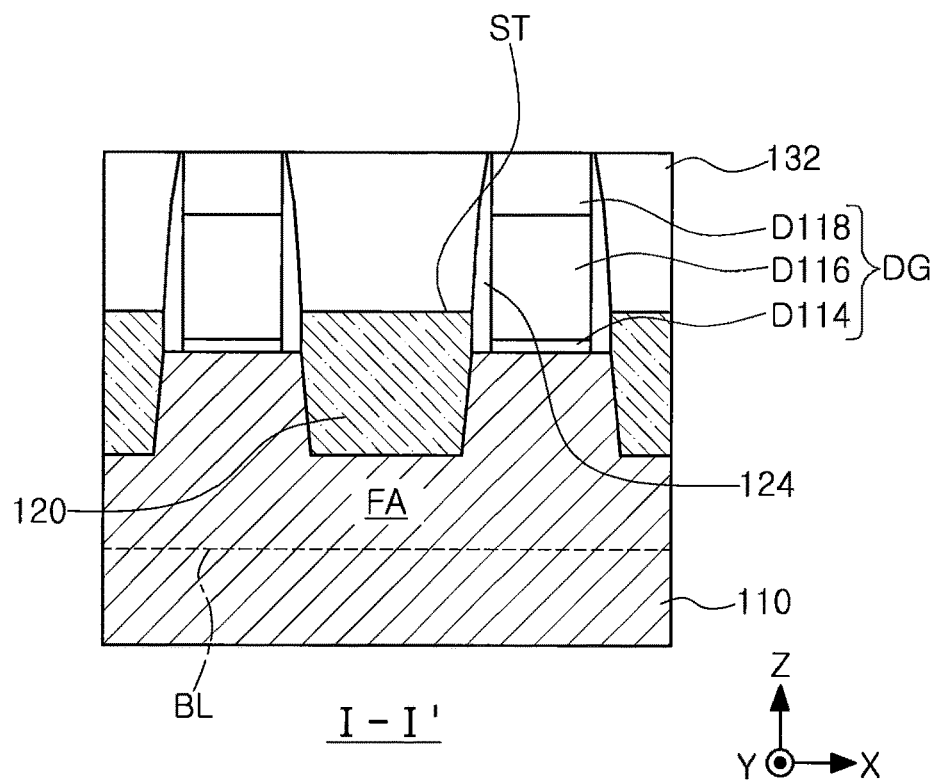
Figure 5B:
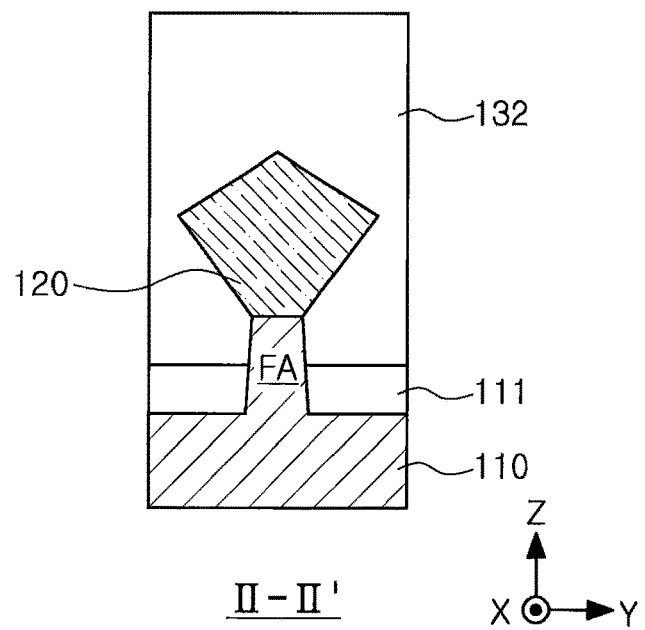

With reference to FIGS. 5A and 5B, a plurality of dummy gate structures DG may be formed on the fin-type active region FA.

The plurality of dummy gate structures DG may be formed to intersect the fin-type active regions FA and be extended in a direction crossing the fin-type active regions FA (e.g., X direction). In addition, each of the plurality of dummy gate structures DG may include a dummy gate insulating film D114, a dummy gate line D116, and a dummy gate capping layer D118, stacked on the fin-type active region FA in sequence. In some embodiments, the dummy gate insulating film D114 may include a silicon oxide. In some embodiments, the dummy gate line D116 may include polysilicon. In some embodiments, the dummy gate capping layer D118 may include, for example, at least one among a silicon oxide, a silicon nitride, and a silicon oxynitride. In addition, an insulating spacer 124 may be formed on opposing side walls of the dummy gate structure DG. The insulating spacer 124 may be formed using, for example, a silicon nitride, a silicon oxynitride or combinations thereof.

A semiconductor layer 120 may be formed on the fin-type active region FA exposed on opposing sides of the dummy gate structure DG, using an epitaxial growth process, thus providing the source/drain regions 120. The source/drain regions 120 may have an upper surface ST disposed on a level higher (e.g., farther from the substrate 110) than that of an upper surface of the fin-type active region FA. The source/drain regions 120 may be formed using a semiconductor layer doped with an impurity. For example, the source/drain regions 120 may be formed using Si, SiGe, or SiC, doped with an impurity.

Subsequently, an intergate insulating film 132 having a polished upper surface may be formed. The intergate insulating film 132 may be formed to be sufficiently thick, in order to partially or substantially cover the source/drain regions 120, the plurality of dummy gate structures DG, and the insulating spacer 124, and then polished to allow the plurality of dummy gate structures DG to be exposed.

Figure 6A:
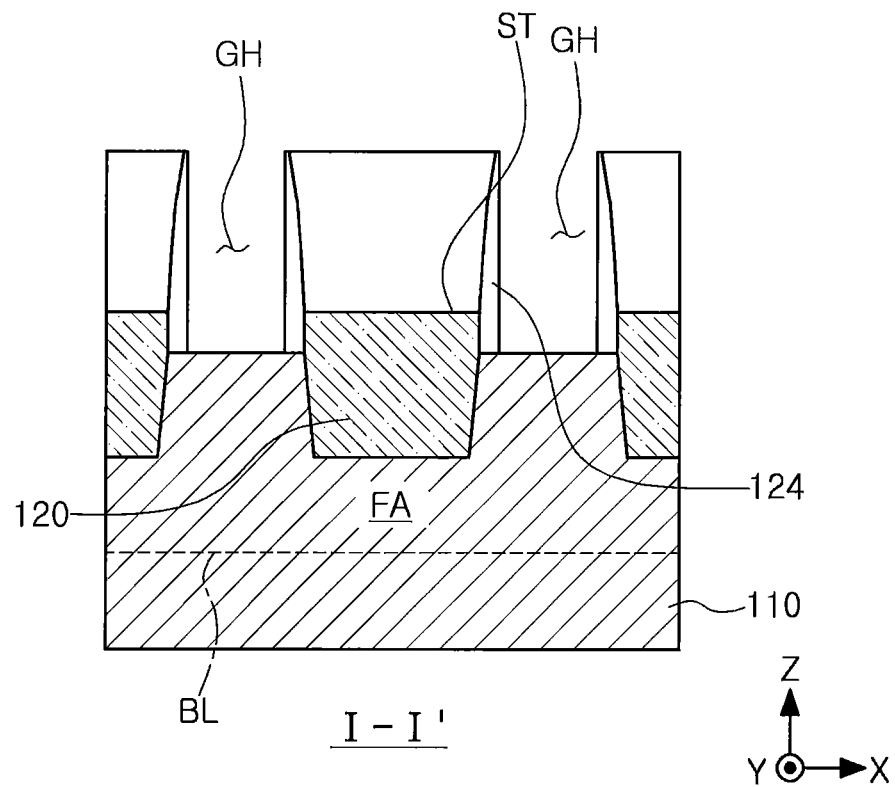
Figure 6B:
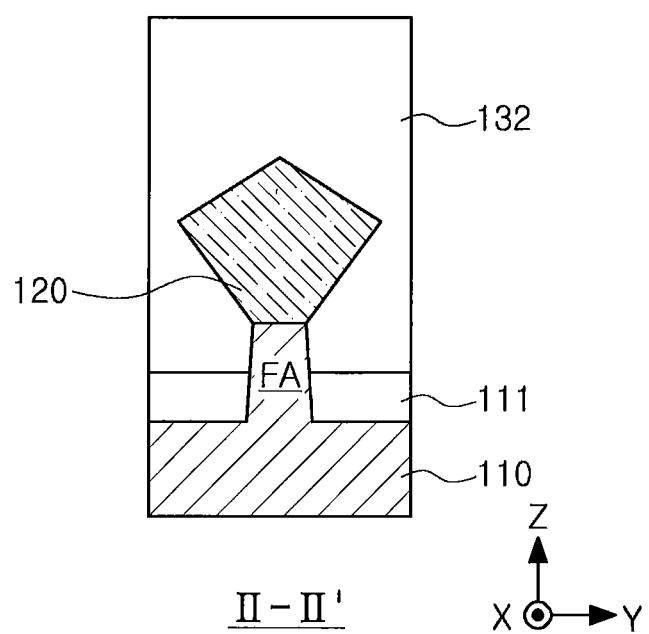

With reference to FIGS. 6A and 6B, the plurality of dummy gate structures DG may be removed, thus forming a plurality of gate holes GH.

The plurality of dummy gate structures DG may be exposed by a polishing process described above and then selectively removed. The insulating spacer 124 and the fin-type active region FA may be exposed by the plurality of gate holes GH.

Figure 7A:
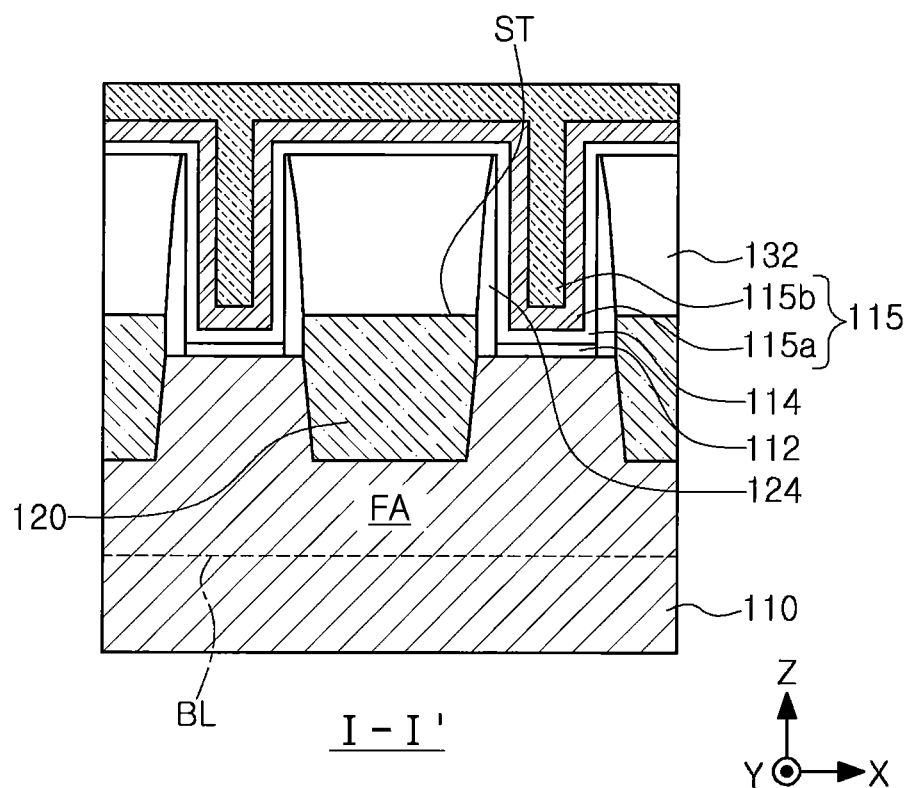
Figure 7B:
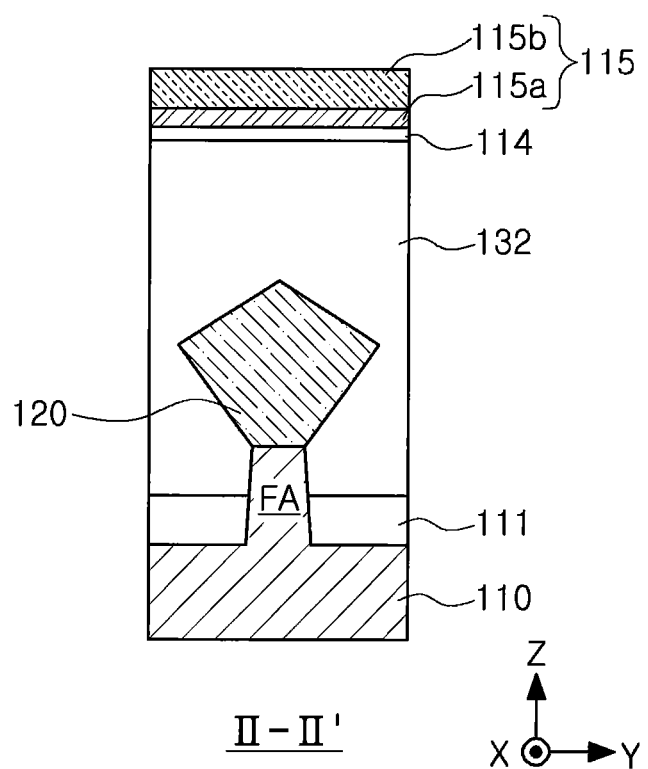

With reference to FIGS. 7A and 7B, a plurality of interface films 112, a plurality of gate insulating films 114, and a plurality of gate lines 115 may be formed in the plurality of gate holes GH (see FIG. 4A) in sequence.

The plurality of interface films 112 may be formed using a process of oxidizing a portion of the fin-type active region FA exposed in the plurality of gate holes GH. The plurality of interface films 112 prevent or reduce an interface defect between the plurality of gate insulating films 114 and the fin-type active region FA from occurring.

The plurality of gate insulating films 114 and the plurality of gate lines 115 may be formed to be within and/or substantially fill an interior of the plurality of gate holes GH and partially or fully cover an upper surface of the intergate insulating film 132. The plurality of gate insulating films 114 may be formed using, for example, a silicon oxide layer, a high dielectric film, or combinations thereof. The gate line 115 may include a first gate electrode layer 115a and a second gate electrode layer 115b. Respective layers introduced in a process described above may be formed using a process of ALD, metal organic ALD (MOALD), or metal organic CVD (MOCVD).

In some embodiments, a conductive capping layer and/or a gap-fill metal film may be additionally formed. The conductive capping layer may prevent or inhibit a surface of the gate line 115 from being oxidized, or may act as a wetting layer in order to facilitate deposition of a different conductive capping layer. In detail, the conductive capping layer may be formed using a metallic nitride, such as, for example, TiN, TaN, or combinations thereof. The gap-fill metal film may be in, or substantially fill, space between the fin-type active regions FA, and may be extended onto the conductive capping layer. The gap-fill metal film may be formed using, for example, a W film.

Figure 8A:
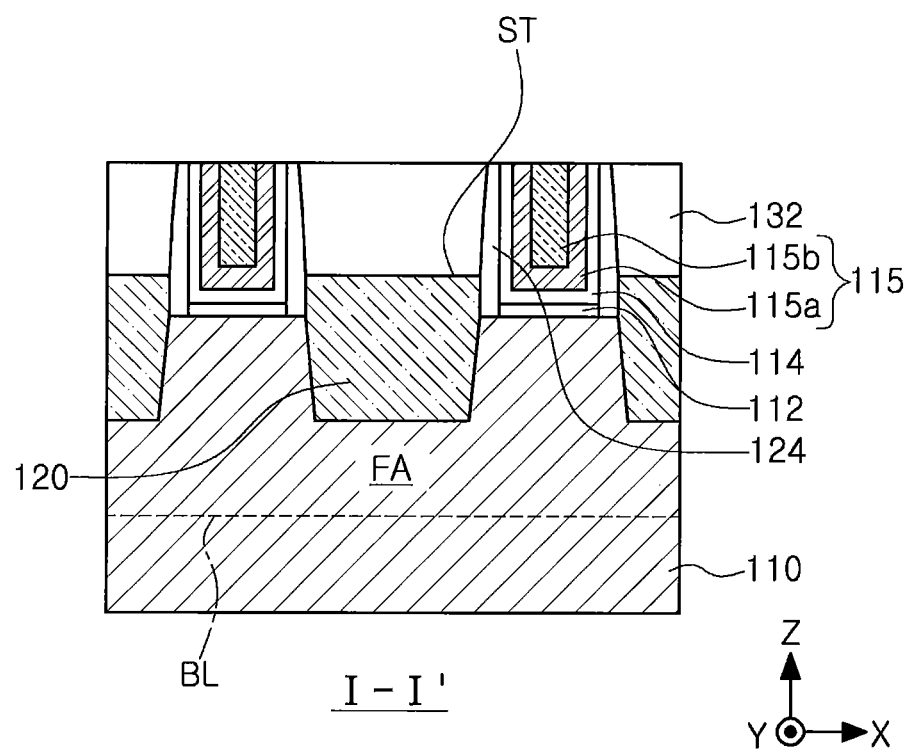
Figure 8B:
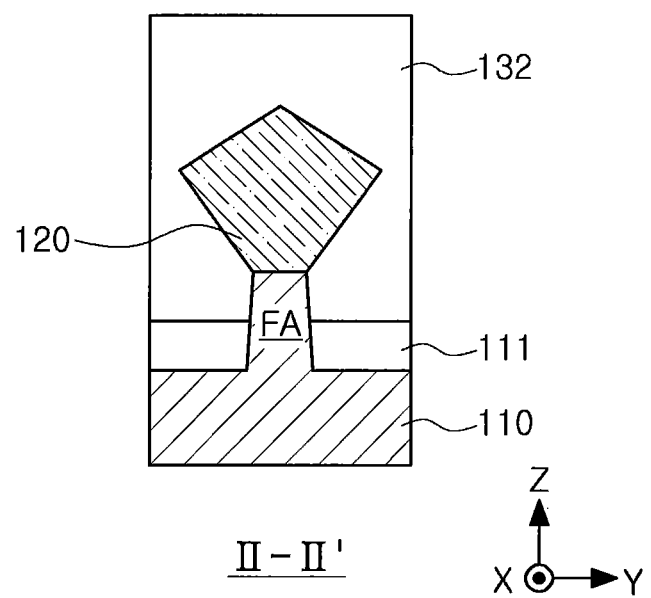

With reference to FIGS. 8A and 8B, a polishing process may be applied to each of the gate line 115 and the gate insulating film 114 to remove portions of the gate line 115 and the gate insulating film 114 that are not within the plurality of gate holes GH.

As a result of the polishing process, an upper surface of each of the insulating spacer 124 and the intergate insulating film 132 may be removed by a predetermined thickness. In addition, upper surfaces of the plurality of gate insulating films 114, the plurality of insulating spacers 124, and the intergate insulating film 132 may be substantially exposed at the same level, around upper surfaces of the plurality of gate lines 115.

Figure 9A:
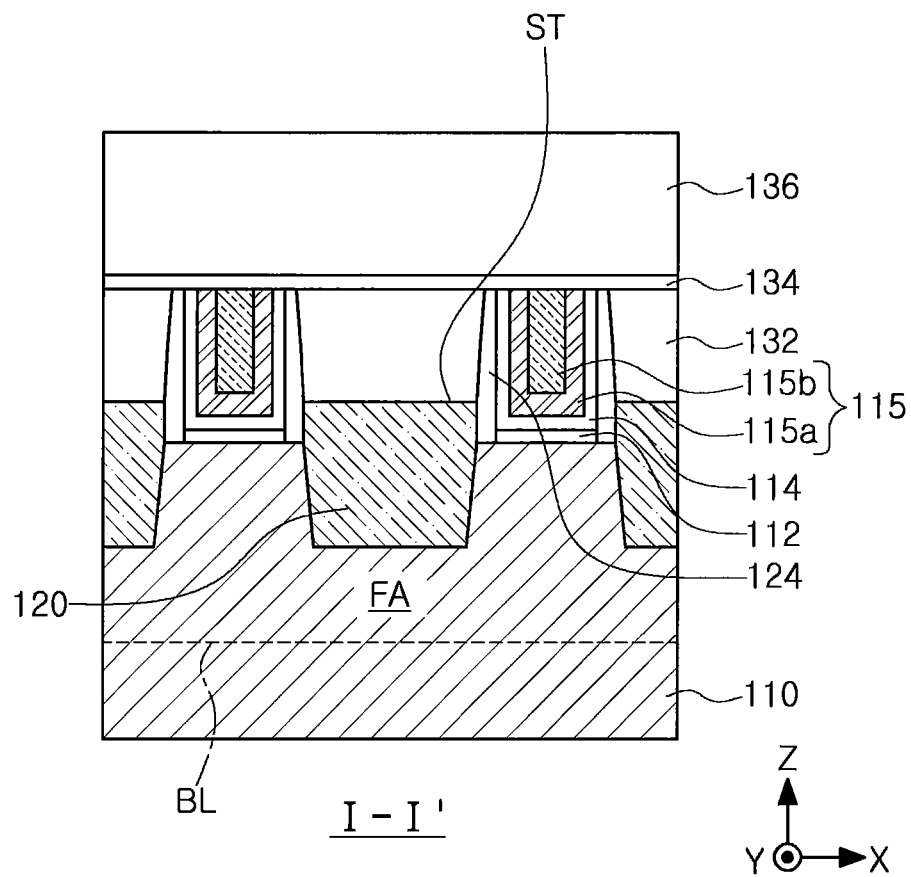
Figure 9B:
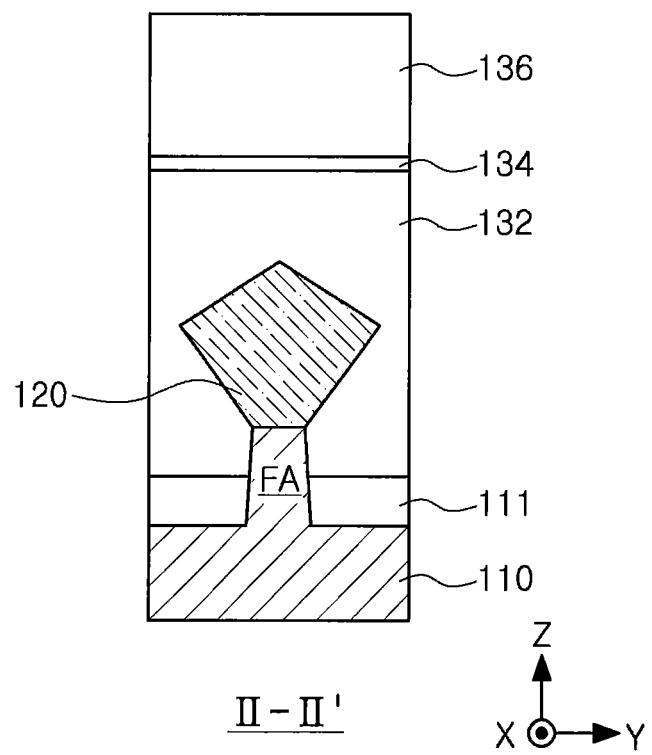

With reference to FIGS. 9A and 9B, a blocking insulating film 134 and an interlayer insulating film 136 may be formed on the plurality of gate lines 115 and the intergate insulating film 132, in sequence.

The interlayer insulating film 136 may be formed to have a polished upper surface. The blocking insulating film 134 is illustrated as having a form of a flat film covering the upper surfaces of the plurality of gate lines 115, but is not limited thereto. For example, the blocking insulating film 134 may be formed on an upper surface of the gate line 115 to cover at least a portion of opposing side walls thereof. In addition, the blocking insulating film 134 may have a step formed in at least a region of the blocking insulating film 134.

Figure 10A:
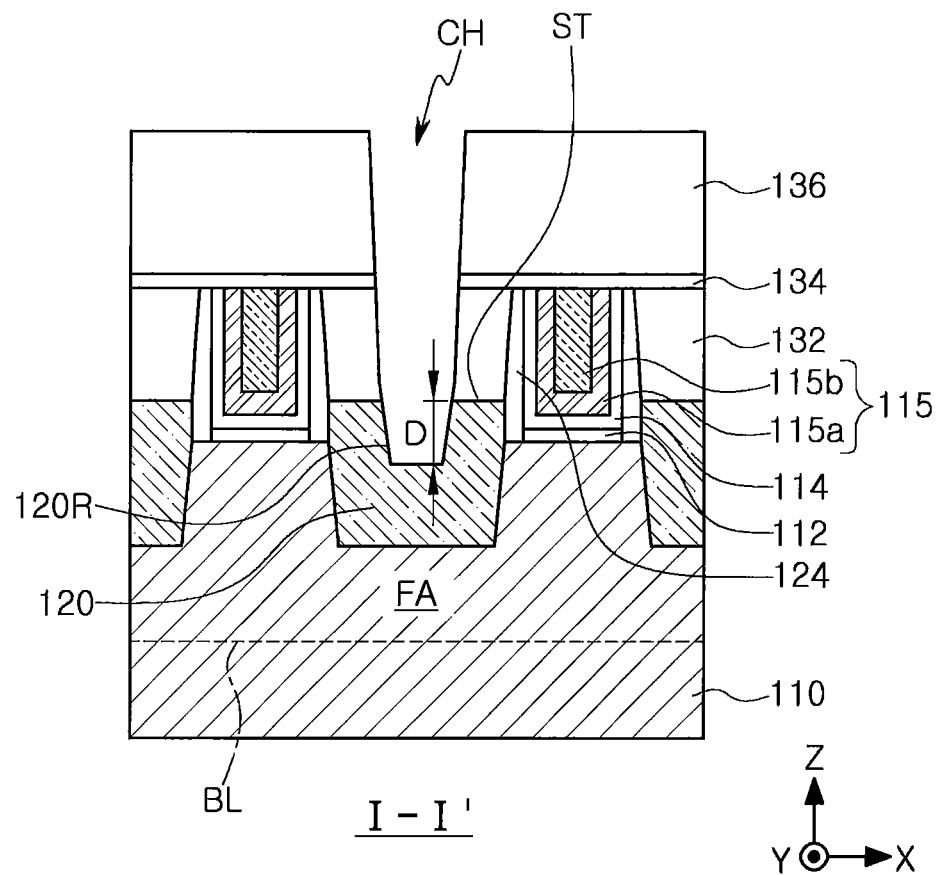
Figure 10B:
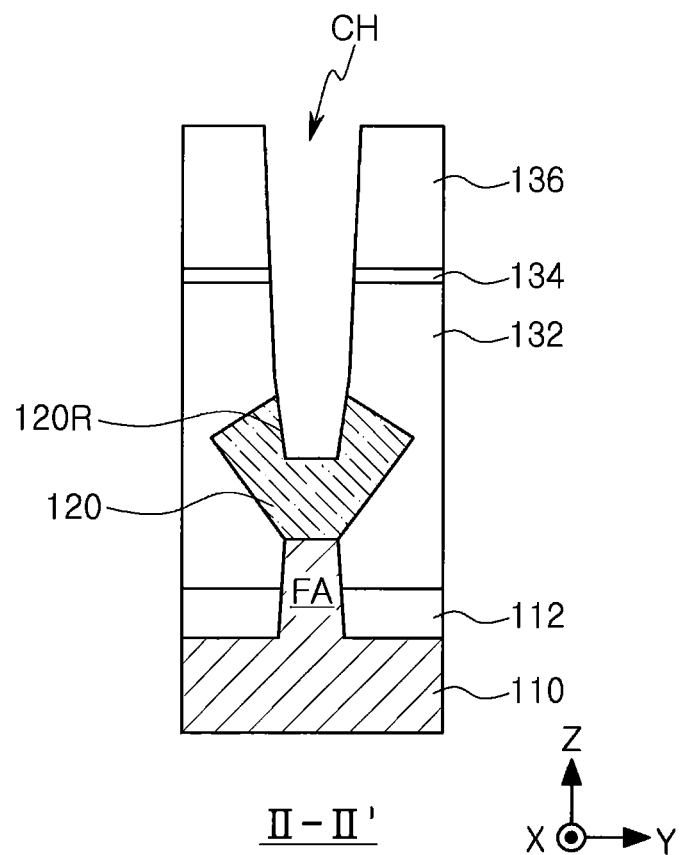

With reference to FIGS. 10A and 10B, a contact hole CH penetrating through the interlayer insulating film 136, the blocking insulating film 134, and the intergate insulating film 132 may be formed in order to allow portions of the source/drain regions 120 to be exposed.

The contact hole CH may be a region in which the contact plug 160 is formed. The contact hole CH may be formed by disposing a mask pattern on the interlayer insulating film 136, and using the mask pattern as an etching mask. In some embodiments, the interlayer insulating film 136, the blocking insulating film 134, and the intergate insulating film 132 may be etched in sequence. Portions of the source/drain regions 120 may be exposed through the contact hole CH.

A region of the source/drain regions 120 exposed when the contact hole CH is formed may be removed by an amount equal to a specific depth D, and a recessed region 120R may be formed in the upper surface ST of the source/drain regions 120. A lower surface of the recessed region 120R at the depth D may have a level lower than that of the upper surface of the fin-type active region FA. The recessed region 120R may have a depth D sufficient for a region of the contact plug (that is, a tip region 160T, see FIG. 2A) to be disposed therein. Therefore, a bottom surface of the recessed region 120R and/or a side wall thereof may be provided as a contact area. As such, in some embodiments, the side wall of the recessed region 120R may be provided as a contact region. Therefore, the depth D of the recessed region 120R may be selected so that a sufficient contact area may be secured.

Figure 11A:
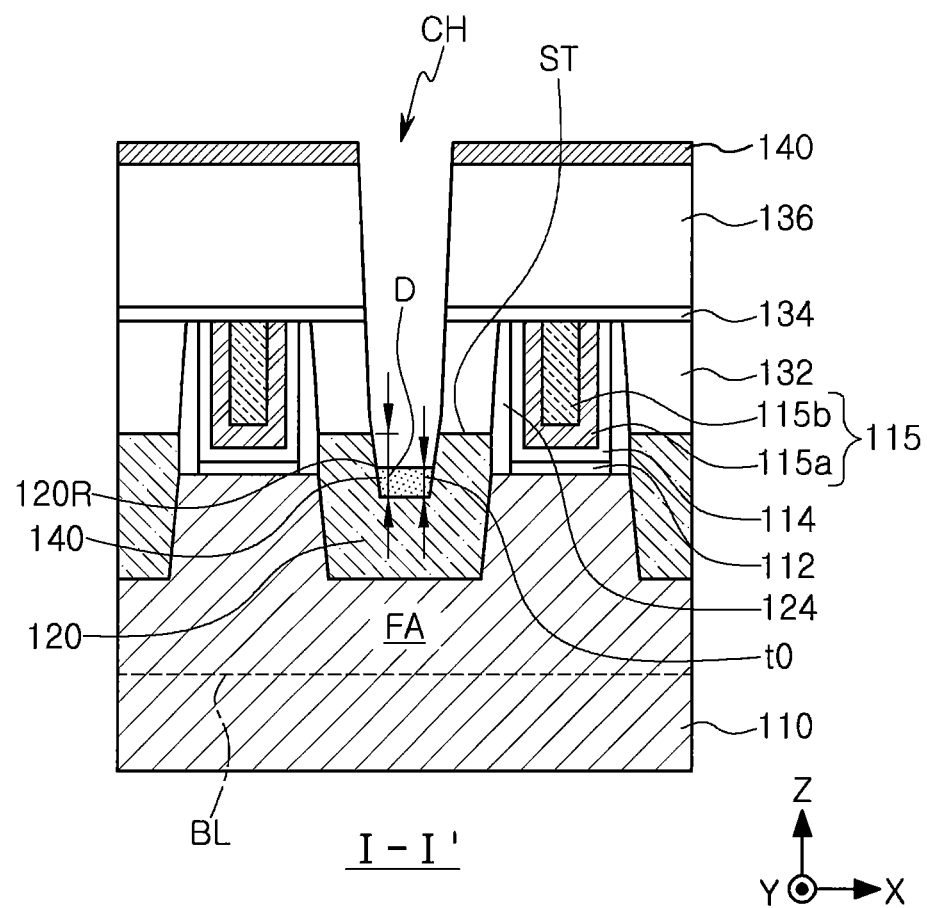
Figure 11B:
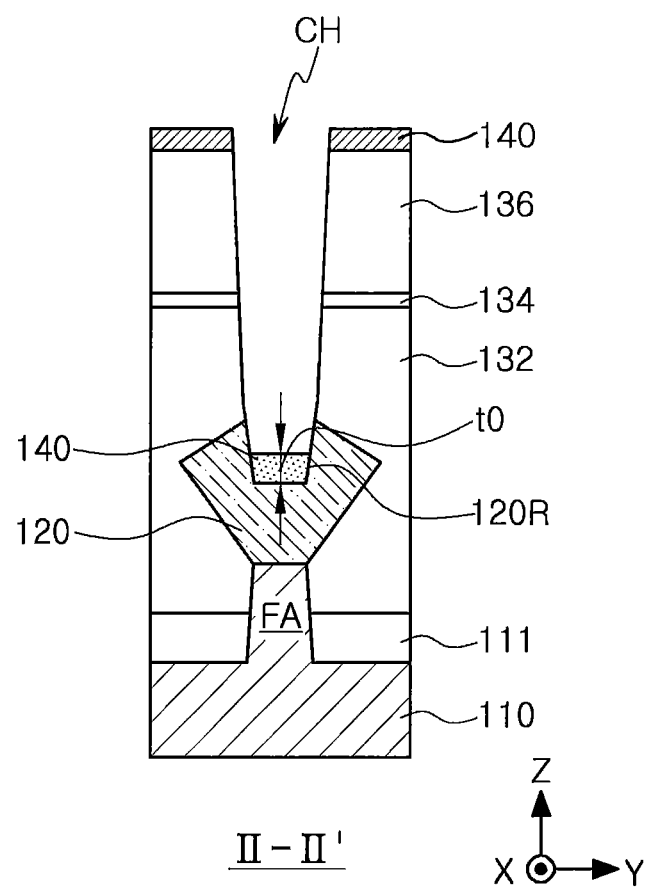

With reference to FIGS. 11A and 11B, a first metal film 140 covering the bottom surface of the recessed region 120R may be formed.

The first metal film 140 may be provided as a metal material to form metallic silicide. For example, the first metal film 140 may be formed using, for example, Ti, Co, Ni, Ta, Pt, or combinations thereof. The first metal film 140 may be formed using a PVD process. The first metal film 140 may be deposited on an upper surface of the interlayer insulating film 136 and on an internal side wall of the contact hole CH, as well as on the bottom surface of the recessed region 120R. In detail, the first metal film 140 may be deposited to have a relatively thin thickness, in order not to interrupt a subsequent process of filling the contact hole CH. In some embodiments, a thickness t0 of the first metal film 140 deposited on the bottom surface of the recessed region 120R may be difficult to be formed to be sufficiently thick to cover to the side wall of the recessed region 120R. Therefore, even after the first metal film 140 is formed, a region of the side wall of the recessed region 120R disposed on the first metal film 140 may be exposed.

Figure 12A:
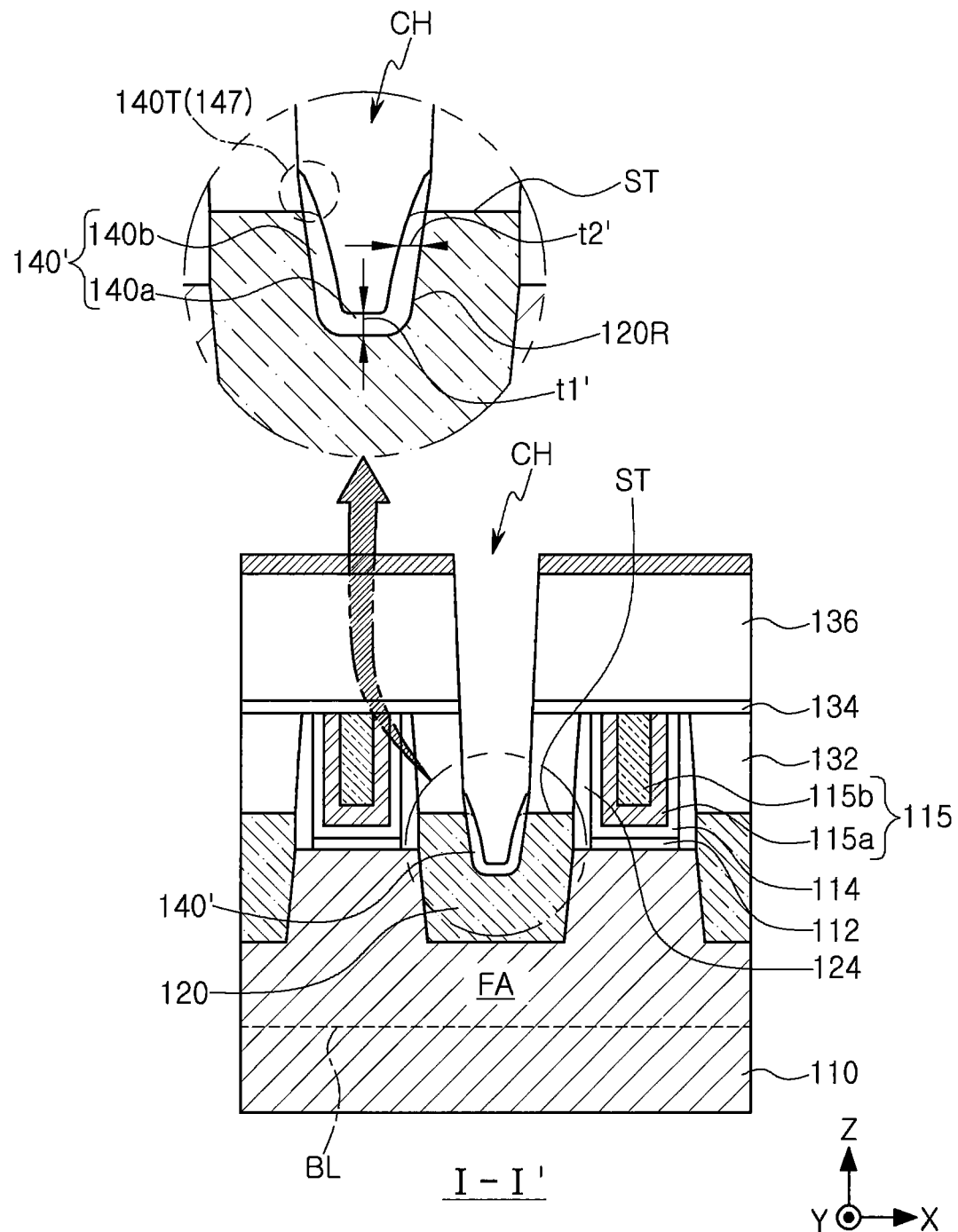
Figure 12B:
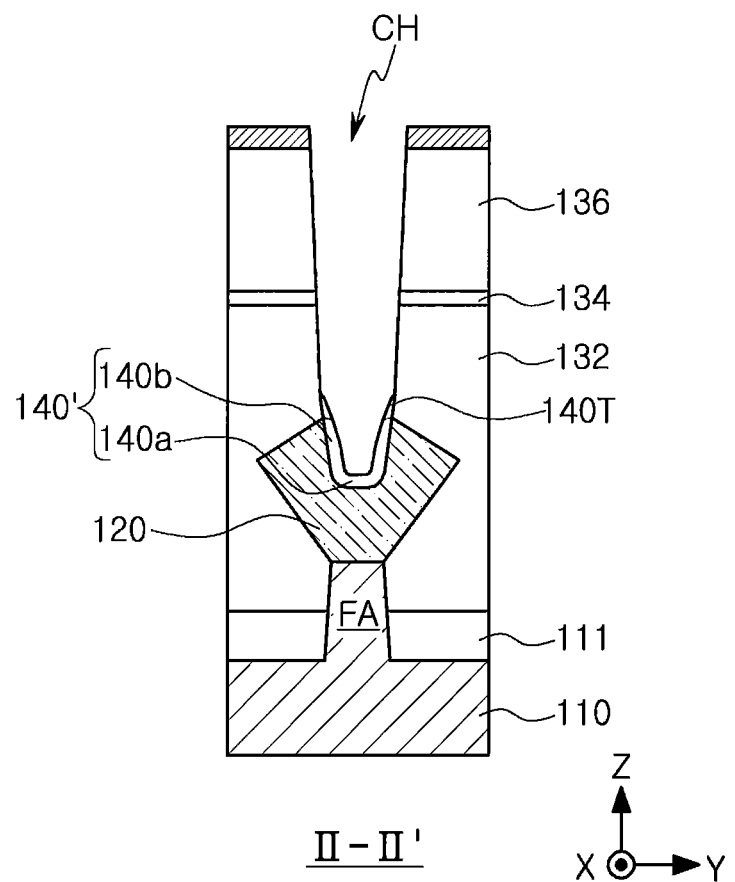

With reference to FIGS. 12A and 12B, through a re-sputtering process performed to the first metal film 140, a second metal film 140' formed on the bottom surface and the side wall of the recessed region 120R may be provided.

The first metal film 140 may be partially distributed on the side wall of the recessed region 120R using the re-sputtering process, thus forming the second metal film 140' extended on the side wall of the recessed region 120R. The second metal film 140' may be disposed on an internal surface of the recessed region 120R. In detail, the re-sputtering process may be performed by a plasma etching process using an inert gas, such as argon (Ar) and neon (Ne).

After deposition of the first metal film 140 (see FIGS. 11A and 11B), the re-sputtering process may be performed in-situ in such a manner that a vacuum is not broken, but the present inventive concepts are not limited thereto. In some embodiments, the re-sputtering process may be performed ex-situ using a different chamber. In addition, while the re-sputtering process is being performed, an impurity, such as a natural oxide layer, that may remain on a surface of the first metal film 140 after the process of FIGS. 11A and 11B may also be removed.

The second metal film 140' that is re-sputtered may include a bottom portion 140a disposed on the bottom surface of the recessed region 120R, and may include a sidewall portion 140b connected to the bottom portion 140a to be integrated therewith and disposed on the side wall of the recessed region 120R. The sidewall portion 140b of the second metal film 140' may be formed to a region higher than the side wall of the recessed region 120R. In other words, the sidewall portion 140b may include a metal portion 140T disposed in a region of the contact hole CH on an exterior of the recessed region 120R. A thickness t1' of the bottom portion 140a may be thinner than a thickness t0 of the first metal film 140. In addition, a thickness t2' of the sidewall portion 140b may be sufficiently thick for a silicide for contact to be formed. For example, the thickness t2' of the sidewall portion 140b may be about 1 nm or greater. In some embodiments, a metal material deposited in the re-sputtering process may be deposited to be significantly thin to a relatively high portion of the side wall of the contact hole CH, higher than the second metal film 140'. A metal film deposited on the side wall of the contact hole CH may provide a barrier film using a nitriding process (see FIG. 16).

Figure 13A:
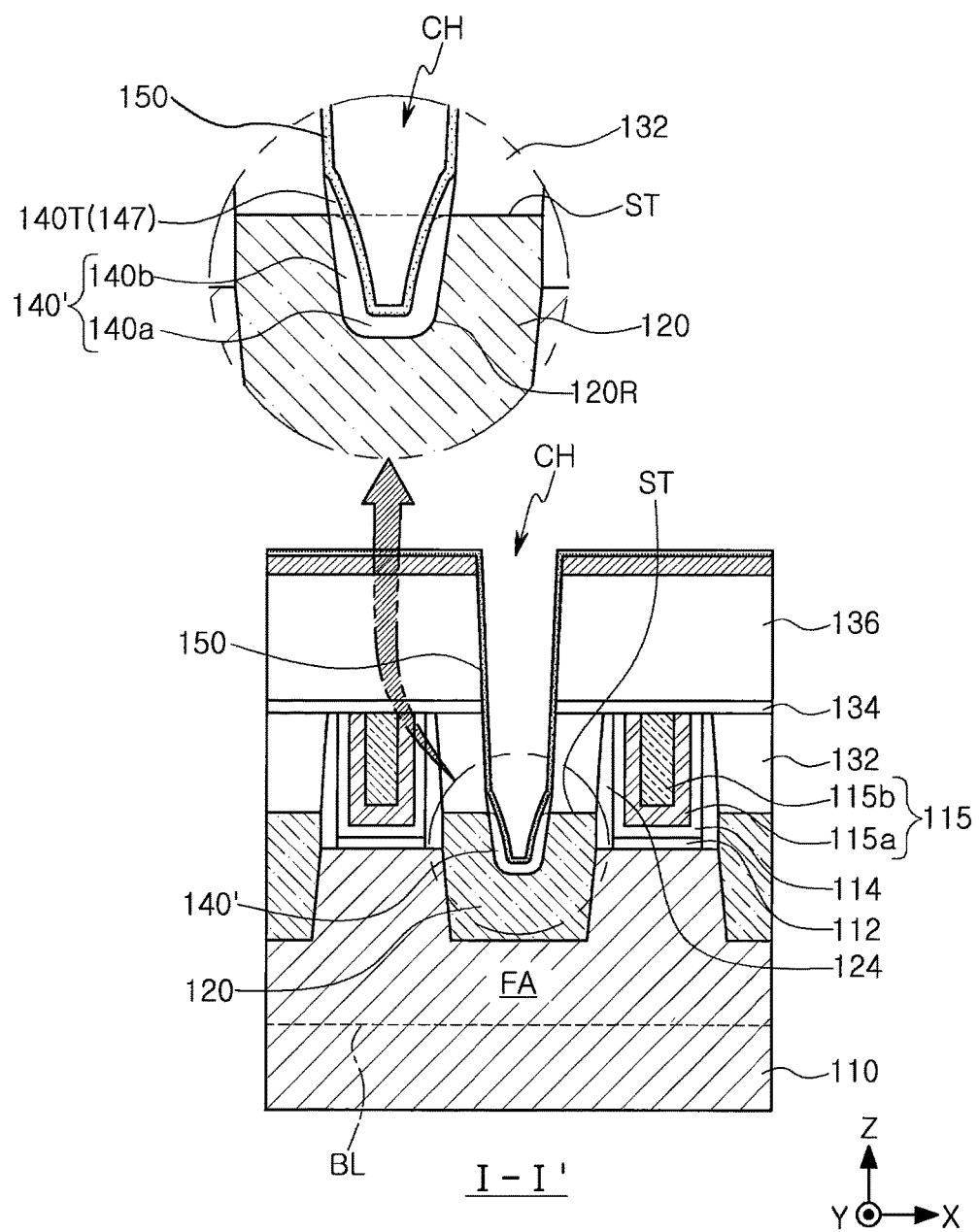
Figure 13B:
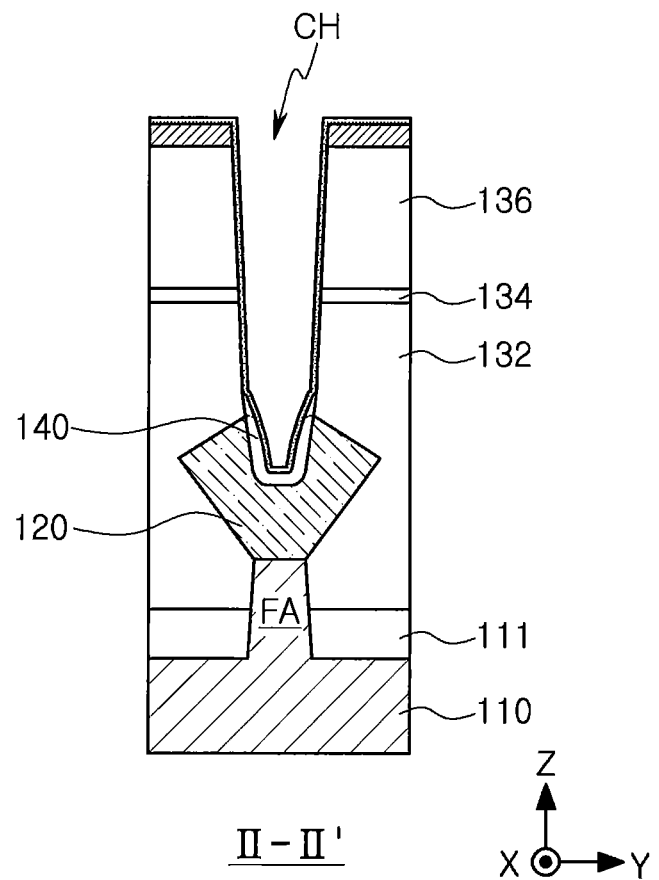

With reference to FIGS. 13A and 13B, a conductive barrier film 150 may be formed on the second metal film 140' and on a side wall of the contact hole CH.

The conductive barrier film 150 may be formed to conformally cover an exposed surface of the second metal film 140' and the internal wall of the contact hole CH. A process described above may be performed using, for example, a process of PVD, CVD, or ALD. In detail, the conductive barrier film 150 may be formed using, for example, TiN, TaN, AlN, WN, or combinations thereof.

Figure 14A:
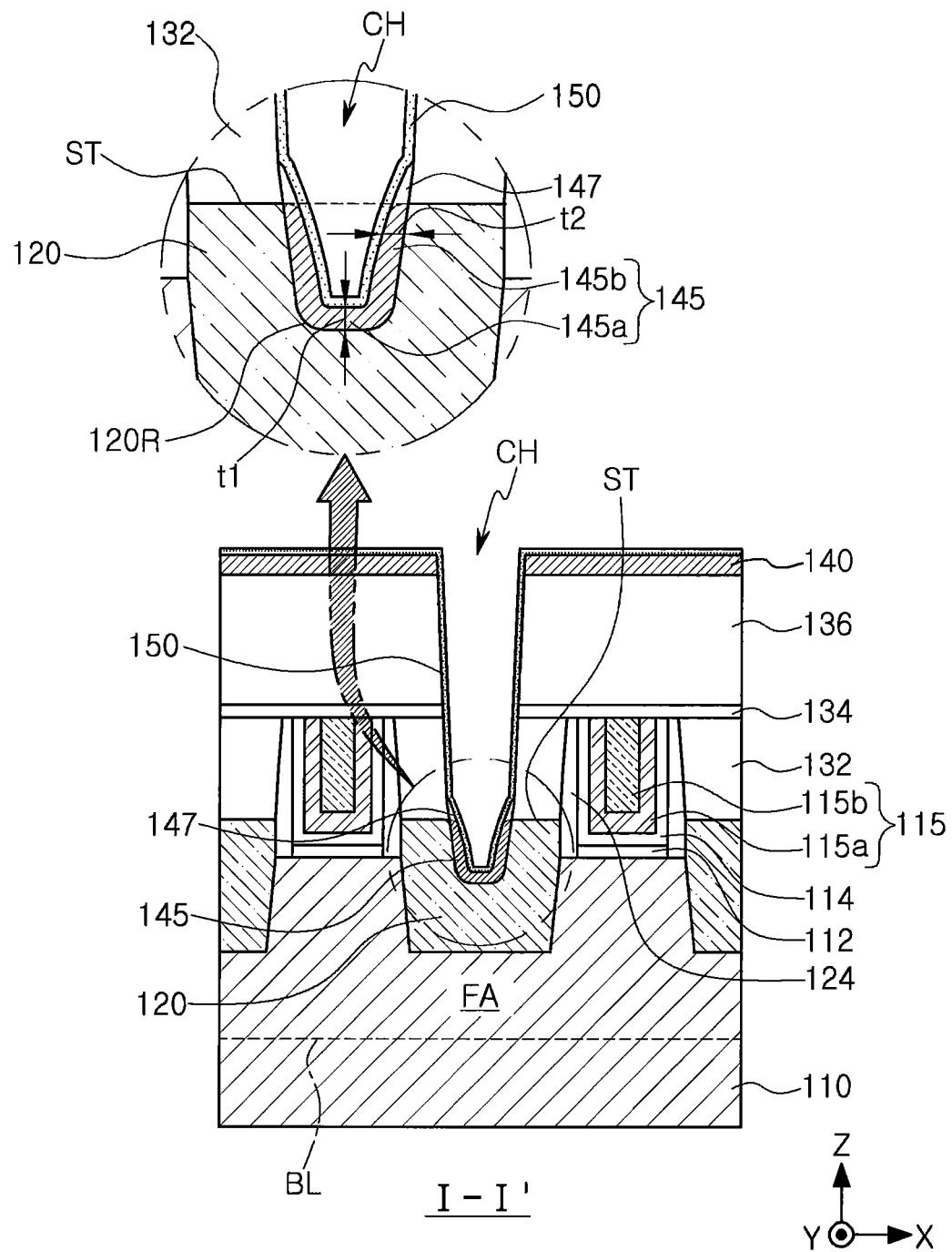
Figure 14B:
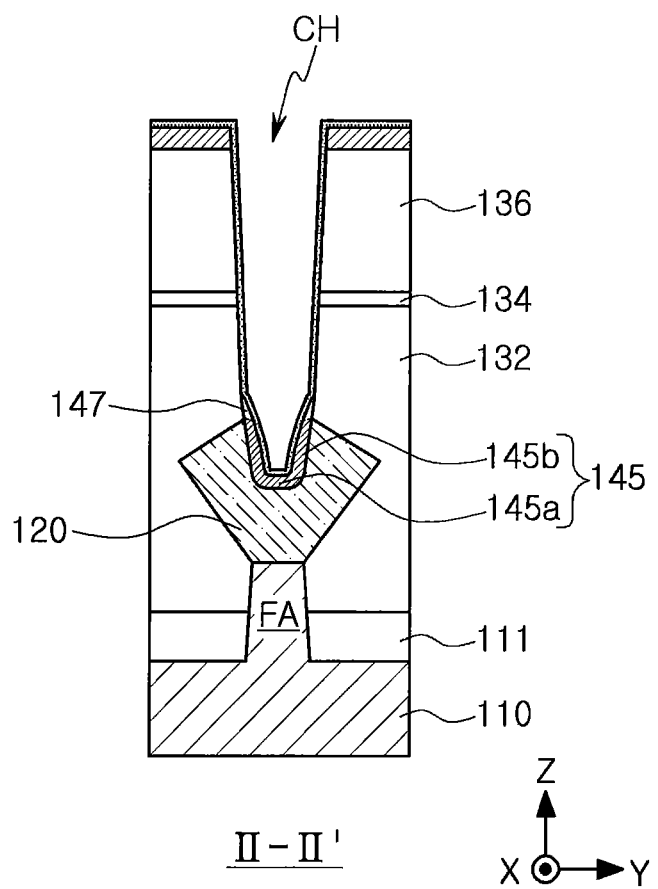

With reference to FIGS. 14A and 14B, a metal silicide film 145 may be formed on the bottom surface and the side wall of the recessed region 120R using a thermal treatment process.

In the thermal treatment process, a reaction between a semiconductor material configuring the source/drain regions 120 and a metal configuring the second metal film 140' may be induced, thus forming the metal silicide film 145 on the source/drain regions 120 in the recessed region 120R. For example, a laser annealing process may be used as the thermal treatment process to form the metal silicide film 145.

Since after the metal silicide film 145 is formed, a region not in contact with a semiconductor material in the second metal film 140', that is, a region disposed on an internal side wall of the contact hole CH, does not react with the semiconductor material, a metal layer 147 that is not silicided may remain. The metal layer 147 may remain between the intergate insulating film 132 and the conductive barrier film 150. In a case in which the metal layer 147 is disposed in a position adjacent to that in which silicon may be diffused, the metal layer 147 may be provided as a metal compound that is not sufficiently silicided, rather than a total metal. In detail, the metal layer 147 that is not sufficiently silicided may contain silicon in an amount of 30 at % or less.

The metal silicide film 145 may include a first portion 145a disposed on the bottom surface of the recessed region 120R and a second portion 145b connected to the first portion 145a to be integrated therewith and disposed on the side wall of the recessed region 120R. After silicidation, a thickness t1 of the first portion 145a may be formed to be thicker than the thickness t1' of the bottom portion 140a of the second metal film 140' (see FIG. 12A). In addition, the thickness t2 of the second portion 145b may be formed to be thicker than the thickness t2' of the sidewall portion 140b of the second metal film 140' (see FIG. 12A). The thickness t2 of the second portion 145b may be gradually reduced in a direction away from the substrate 110. In addition, a thickness of the metal layer 147 may be thinner than the thickness t2 of the second portion 145b of the metal silicide film 145.

Figure 15A:
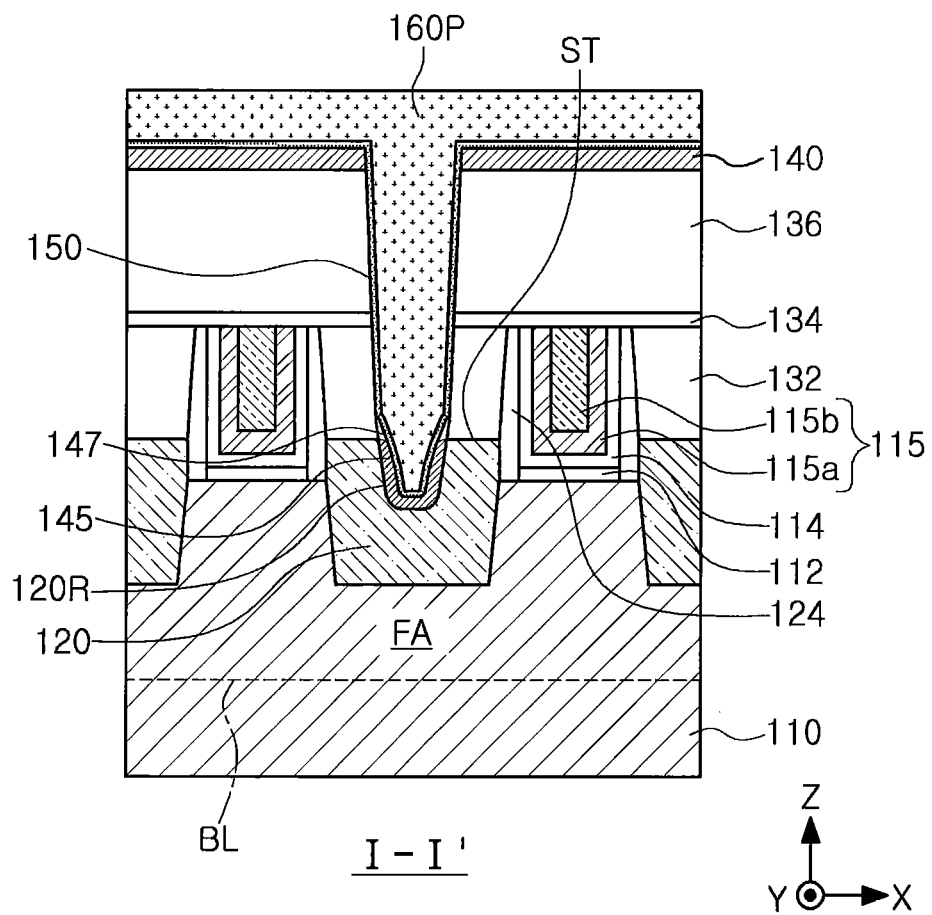
Figure 15B:
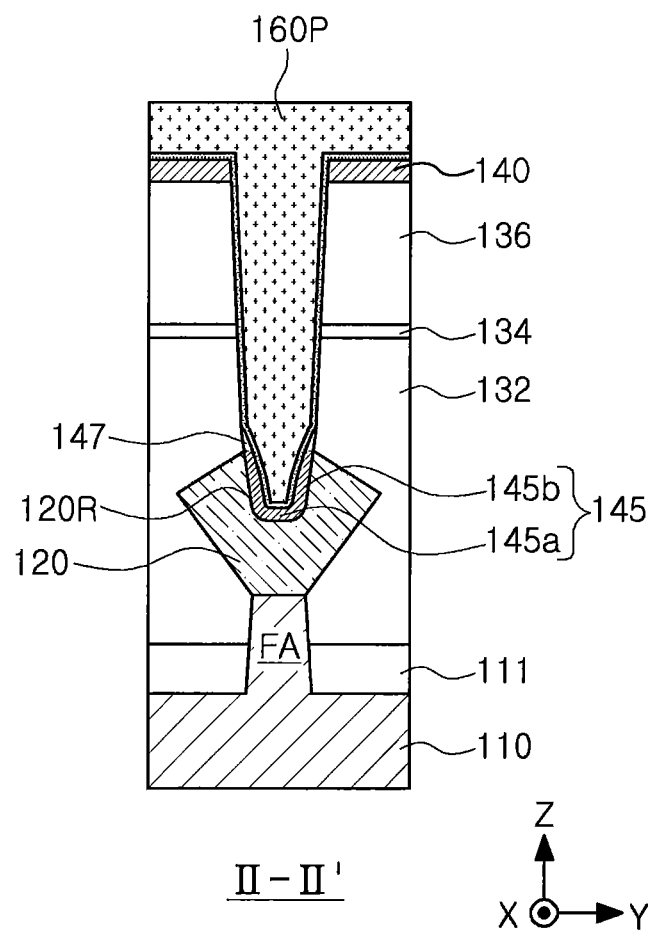

With reference to FIGS. 15A and 15B, a conductive film 160P may be formed to have a thickness sufficient to fill the contact hole CH and the recessed region 120R.

The conductive film 160P may be formed to be within and/or substantially fill an interior of the contact hole CH and the recessed region 120R and cover the conductive barrier film 150, on the upper surface of the interlayer insulating film 136. In some embodiments, the conductive film 160P may be formed using, for example, W, Cu, Al, alloys thereof, or combinations thereof. In order to allow the upper surface of the interlayer insulating film 136 to be exposed and allow the conductive barrier film 150 and the conductive film 160P to remain only in the contact hole CH and the recessed region 120R, portions formed on the upper surface of the interlayer insulating film 136 among the first metal film 140, the conductive barrier film 150, and the conductive film 160P may be removed. In some embodiments, the removal process may be performed by a polishing process, such as, for example, a CMP process.

Consequently, as illustrated in FIGS. 2A and 2B, a contact plug 160 filling the interior of the contact hole CH and the recessed region 120R, and the conductive barrier film 150 surrounding the contact plug 160 in the contact hole CH, may remain.

Example embodiments described herein include examples in which a contact plug 160 for source/drain regions 120 is formed in a FinFET device, but the present inventive concepts are not limited thereto. The example embodiments described herein may be used as methods of forming a contact structure provided to an active region of a different device, as well as methods of forming a source/drain region of a different device, such as a flat MOSFET device.

Figure 16:
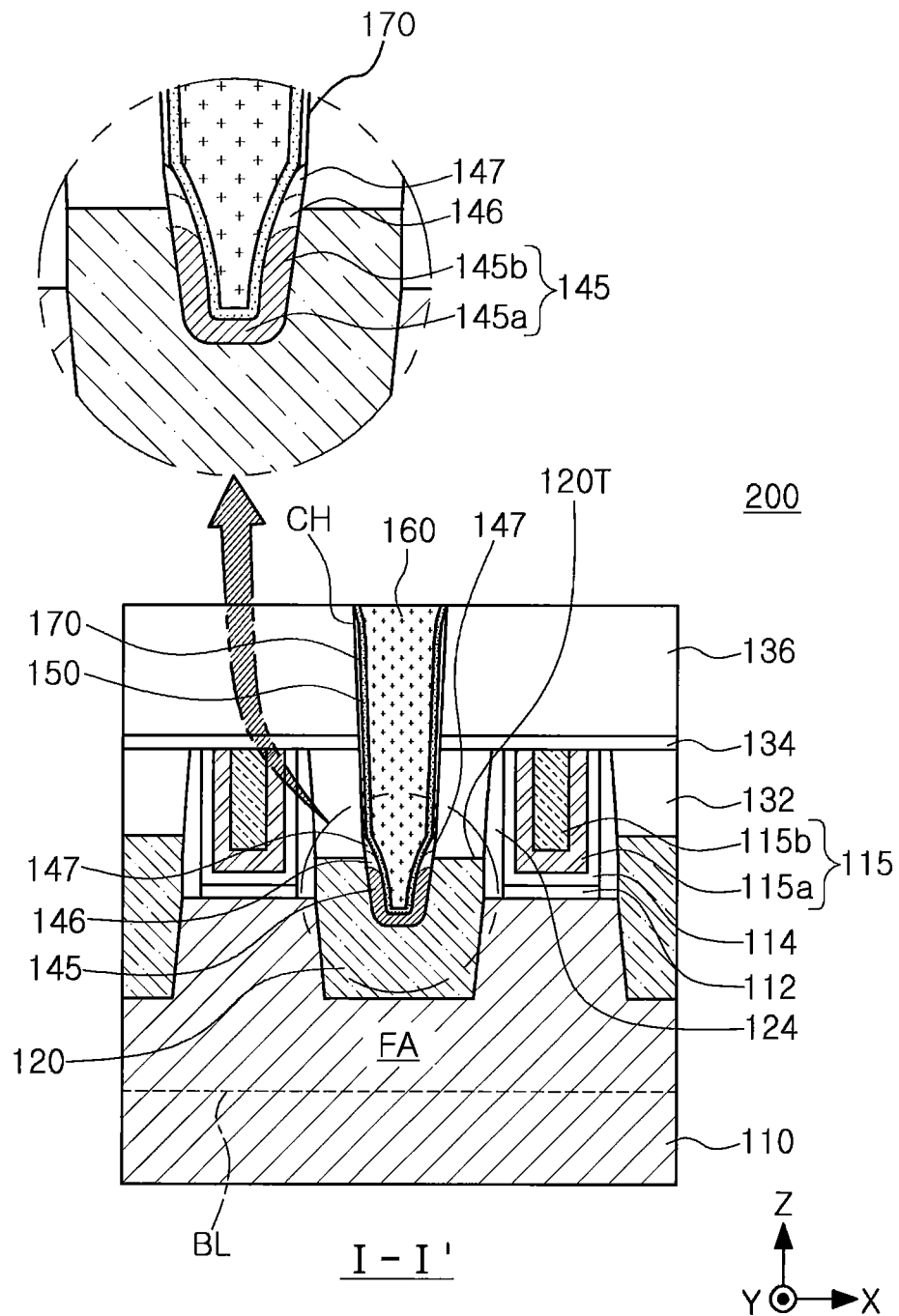
FIG. 16 is a cross-sectional view of a semiconductor device according to an example embodiment of the present inventive concepts.

FIG. 16 is a cross-sectional view of a semiconductor device 200 according to an example embodiment of the present inventive concepts. The semiconductor device 200 illustrated in FIG. 16 may have a layout similar to that illustrated in FIG. 1, and the cross-sectional view of FIG. 16 is taken along line I-I' as illustrated in FIG. 1. In addition, like reference characters refer to the like members previously described herein, and a description thereof may be omitted for brevity.

With reference to FIG. 16, the semiconductor device 200 may have a composition substantially the same as that of a semiconductor device 100, according to an embodiments described herein, except that the semiconductor device 200 may further include an additional barrier film 170 interposed between an upper region of the conductive barrier film 150 and a contact hole CH, and may include an intermediate silicide region 146 interposed between a metal silicide film 145 and a metal layer 147.

In some embodiments, the additional barrier film 170 may be formed before the conductive barrier film 150 is formed. The additional barrier film 170 may be provided as a nitride layer including a metal contained in the metal layer 147 and the metal silicide film 145. A metal material dispersed in a re-sputtering process, such as the one illustrated in FIGS. 12A and 12B, may be deposited on an internal side wall of the contact hole CH. The metal material may remain on the internal side wall of the contact hole CH, although an amount thereof may be smaller than that remaining on an internal side wall of the recessed region 120R. A residual metal material described above may be nitrided before the conductive barrier film 150 is formed, thus providing the additional barrier film 170. In some embodiments, in a case in which the metal layer 147 and the metal silicide film 145 are provided as Ti and titanium silicide, respectively, the additional barrier film 170 may be provided as TiN. In some embodiments, if the conductive barrier film 150 is formed using TiN, the conductive barrier film 150 may not be distinguished from the additional barrier film 170 (i.e., the conductive barrier film 150 and the additional barrier film 170 may be shown to be a single layer). However, in some embodiments, if the conductive barrier film 150 is formed using a different material (e.g., TaN, or the like), the conductive barrier film 150 may be shown to be two layers (e.g., the conductive barrier film 150 and the additional barrier film 170).

In some embodiments, the intermediate silicide region 146 may be interposed between the metal silicide film 145 and the metal layer 147, on a surface of the recessed region 120R. The intermediate silicide region 146 may be formed to be integrated with the metal silicide film 145 and the metal layer 147. A silicon content of the intermediate silicide region 146 may gradually be reduced in the intermediate silicide region 146. Furthermore, the metal layer 147 that substantially does not contain silicon may be present. The intermediate silicide region 146 may have a region in which a metal content is higher than that of the metal silicide film 145. In some embodiments, the silicon content of the intermediate silicide region 146 may be 30 at % or less. The intermediate silicide region 146 may be disposed in a region disposed adjacently to an upper surface of the active region FA, or may be disposed on a level higher than that of the upper surface thereof. In an example embodiment, as described above, only the intermediate silicide region 146, containing silicon in an amount of 30 at % or less, may be formed on the metal silicide film 145, rather than the metal layer 147.

Figure 17:
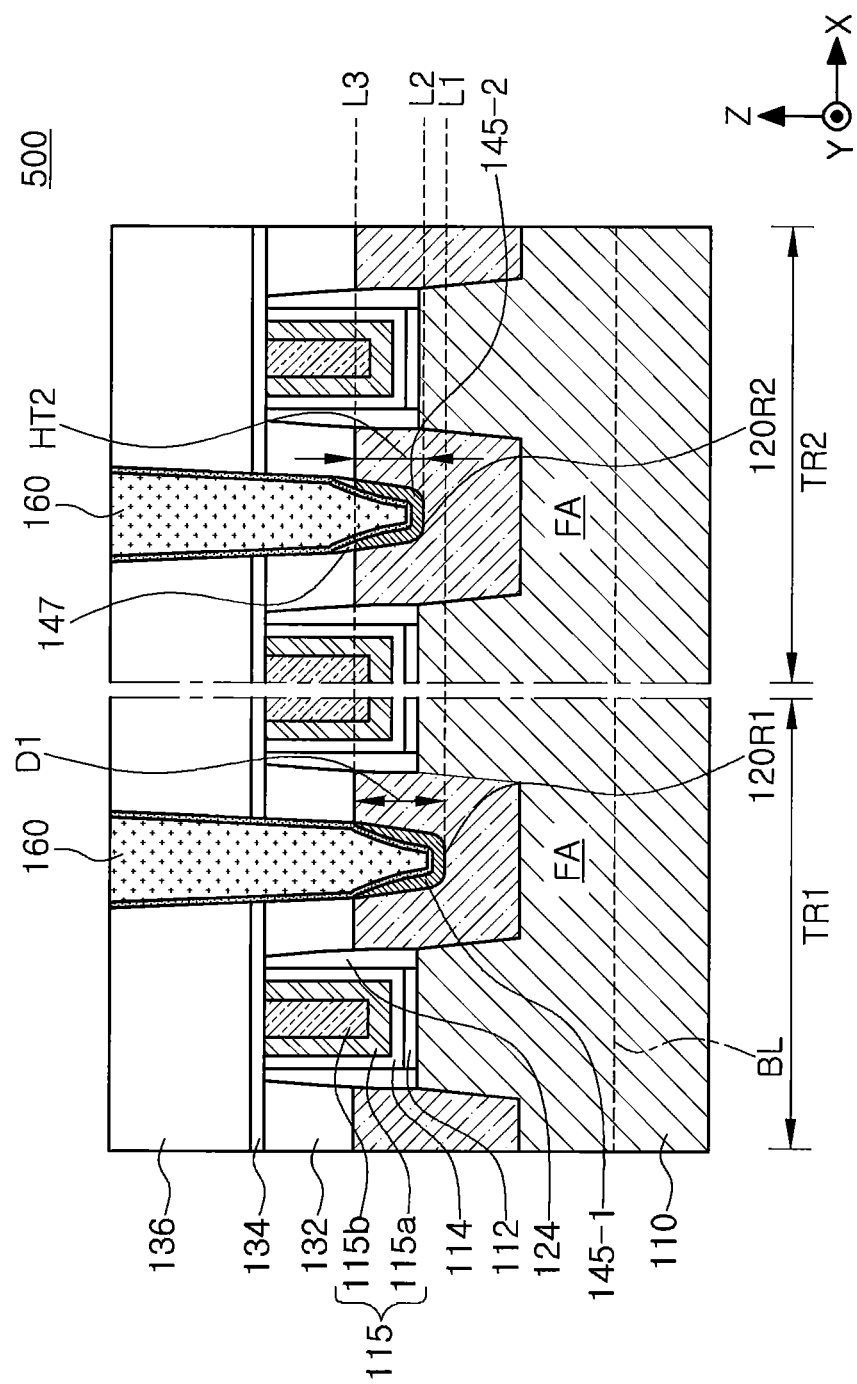
FIG. 17 is a cross-sectional view of a semiconductor device according to an example embodiment of the present inventive concepts.

FIG. 17 is a cross-sectional view of a semiconductor device 500 according to an example embodiment of the present inventive concepts. In FIG. 17, reference characters that are the same as that of example embodiments described herein refer to similar members, and an overlapping description thereof will be omitted.

With reference to FIG. 17, a substrate 110 may include a first device region TR1 and a second device region TR2, in an integrated circuit (IC) device 500.

The first device region TR1 and the second device region TR2 may be provided as regions having different electrical characteristics. In some embodiments, the first device region TR1 and the second device region TR2 may have different conductivity types. In some embodiments, the first device region TR1 and the second device region TR2 may be provided as regions forming transistors having different channel types. For example, the first device region TR1 may be provided as a region including a p-type metal oxide semiconductor (PMOS) transistor, while the second device region TR2 may be provided as a region including an n-type metal oxide semiconductor (NMOS) transistor.

The first device region TR1 and the second device region TR2 may have a composition similar to those of example embodiments described herein. However, a first level L1, a level of a bottom surface of a metal silicide film 145-1 of the PMOS transistor formed in the first device region TR1 may be different from a second level L2, a level of a bottom surface of a metal silicide film 145-2 included in the NMOS transistor formed in the second device region TR2.

For example, as illustrated in FIG. 17, the first level L1 may be disposed to be lower (e.g. nearer the substrate 110) than the second level L2. Therefore, the first level L1 may be disposed nearer to a level of a bottom surface of a fin-type active region FA than the second level L2. In addition, the first level L1 and the second level L2 may be disposed to be lower than a third level L3, a level of an upper surface of the fin-type active region FA. Therefore, the second level L2 may be disposed nearer to the upper surface of the fm-type active region FA than the first level L1, as an etching rate of source/drain regions 120 of the PMOS transistor may be higher than that of the NMOS transistor. Therefore, in the same etching process as the etching process used to form a contact hole (see FIGS. 11A and 11B), the first level L1 may be disposed to be lower than the second level L2.

In the first device region TR1, a level of a bottom surface of a recessed region 120R1 formed in source/drain regions 120 may correspond to the first level L1. In the second device region TR2, a level of a bottom surface of a recessed region 120R2 formed in the source/drain regions 120 may correspond to the second level L2. In some embodiments, levels of upper surfaces of the source/drain regions 120 formed in each of the first device region TR1 and the second device region TR2 may be substantially equal to each other.

The metal silicide film 145-1 of the first device region TR1 may include a first portion disposed on a bottom surface of the recessed regions 120R1 and a second portion disposed on a side wall of the recessed regions 120R1. In addition, the metal silicide film 145-2 of the second device region TR2 may include a first portion disposed on a bottom surface of the recessed regions 120R2 and a second portion disposed on a side wall of the recessed regions 120R2. However, a metal layer 147, described herein, may be present only in the metal silicide film 145-2 of the second device region TR2, while the metal layer 147 may not be present on the metal silicide film 145-1 of the first device region TR1.

In some embodiments, when a first metal film is formed in contact holes of the first device region TR1 and the second device region TR2, using the same process (see FIGS. 12A and 12B), and a re-sputtering process having the same conditions is performed (see FIGS. 13A and 13B), a height of a metallic sidewall portion re-sputtered on a side wall of a recessed region (or a contact hole) may be different based on a top level L3 of the fm-type active region FA. In some embodiments, in a case in which process conditions are set to allow a level of the metallic sidewall portion to be substantially equal to the top level L3 of the fin-type active region FA in the first device region TR1, the metallic sidewall portion in the second device region TR2 may be disposed at a level higher than that of the top level L3 of the fin-type active region FA because depth of the contact hole in the second device region TR2 is more shallow than that of the first device region TR1.

Consequently, as illustrated in FIG. 17, the metal layer 147 may remain only on the metal silicide film 145-2 disposed in the second device region TR2. In some embodiments, the metal layer 147 may be present on the metal silicide film 145-1 and the metal silicide film 145-2 in both the first device region TR1 and the second device region TR2. In this case, thicknesses of the metal layers 147 may be different.

Figure 18:
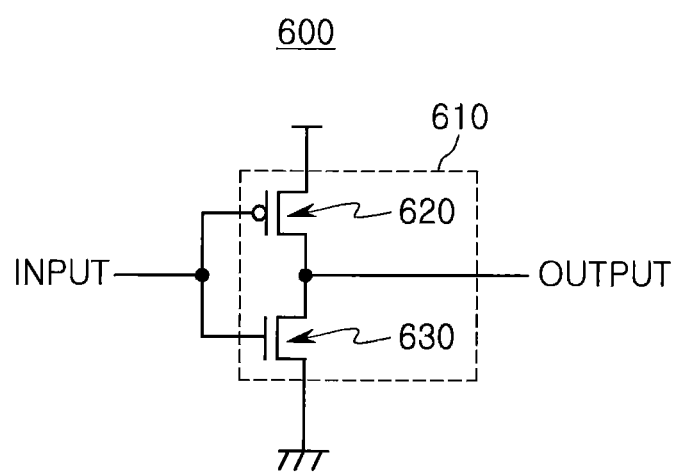
FIG. 18 is a circuit diagram of a complementary metal oxide semiconductor (CMOS) inverter, a semiconductor device, according to an example embodiment of the present inventive concepts.

FIG. 18 is a circuit diagram of a CMOS inverter 600, a semiconductor device, according to an example embodiment of the present inventive concepts.

With reference to FIG. 18, a CMOS inverter 600 may include a CMOS transistor 610. The CMOS transistor 610 may include a PMOS transistor 620 and an NMOS transistor 630, connected between a power terminal and a ground terminal and receiving an input. The CMOS transistor 610 may include a semiconductor device 500 described with reference to FIG. 17.

Figure 19:
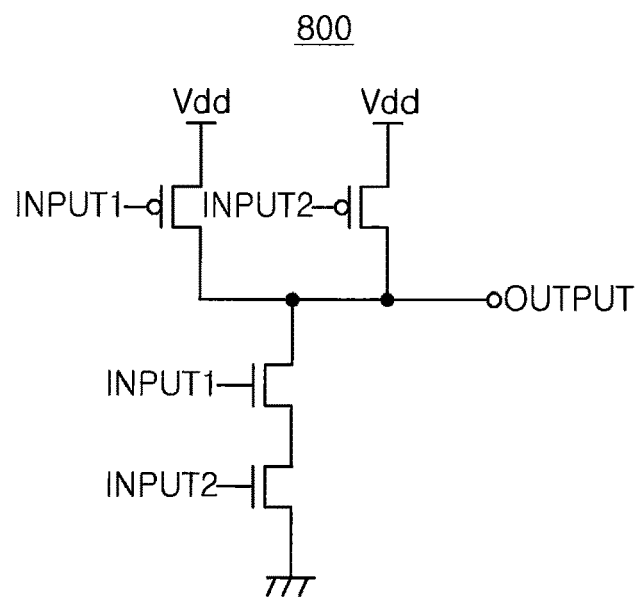
FIG. 19 is a circuit diagram of CMOS NAND, a semiconductor device, according to an example embodiment of the present inventive concepts.

FIG. 19 is a circuit diagram of CMOS NAND, a semiconductor device, according to an example embodiment of the present inventive concepts.

With reference to FIG. 19, a CMOS NAND circuit 800 may include a pair of CMOS transistors to which different input signals (e.g. INPUT1, INPUT 2) are transmitted. At least one transistor of the pair of CMOS transistors may include the semiconductor device 500 described with reference to FIG. 17.

Figure 20:
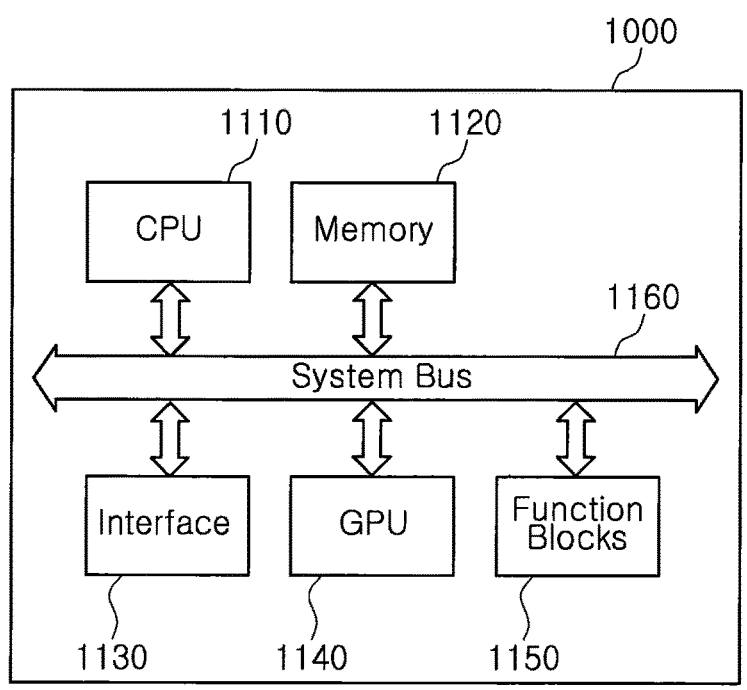
FIG. 20 is a schematic view of a composition of a system-on-chip (SoC) provided as a semiconductor device according to an example embodiment of the present inventive concepts.

FIG. 20 is a schematic view of a composition of a system-on-chip (SoC) 1000 provided as a semiconductor device according to an example embodiment of the present inventive concepts.

With reference to FIG. 20, an SoC 1000 may include a central processing unit (CPU) 1110, a memory 1120, an interface 1130, a graphic processing unit (GPU) 1140, function blocks 1150, and a bus 1160 connecting components described above. The CPU 1110 may control an operation of the SoC 1000. The CPU 1110 may include a core and an L2 cache. In some embodiments, the CPU 1110 may include a multicore having multiple cores. Performance of respective cores of the multicore may be the same or different. In addition, respective cores of the multicore may be activated simultaneously or at different times. The memory 1120 may store a result processed in the function blocks 1150, by control of the CPU 1110. In some embodiments, a content stored in the L2 cache of the CPU 1110 may be flushed, thus being stored in the memory 1120. The interface 1130 may perform interfacing with respect to external devices. For example, the interface 1130 may perform interfacing with respect to a camera, a liquid crystal display (LCD), and/or a speaker.

The GPU 1140 may perform graphic functions that the SoC is required to perform. For example, the GPU 1140 may perform a video codec, and/or process a 3D graphic. The function blocks 1150 may perform various functions that the SoC is required to perform. For example, in a case in which the SoC 1000 is provided as an application processor (AP) used in a mobile device, a portion of the function blocks 1150 may perform a communications function. The SoC 1000 may include the semiconductor device 500 described with reference to FIG. 17.

According to example embodiments of the present inventive concepts, a metal silicide film may be disposed on a lower surface of a contact plug and/or extended to a side surface of a portion thereof, thus reducing contact resistance between an active region, such as source/drain regions, and the contact plug.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While example embodiments of the present inventive concepts have been shown and described above, it will be apparent to those skilled in the art that modifications and variations could be made without departing from the scope of the present inventive concepts as defined by the appended claims.

What is claimed is:

1. A semiconductor device, comprising:
a substrate;
an active region in the substrate;
a source/drain region in the active region,
    wherein the source/drain region comprises a recessed region having a lower surface that is closer to the substrate than an uppermost surface of the source/drain region;
a contact plug on the source/drain region, wherein the contact plug has a lower portion within the recessed region of the source/drain region;
a metal silicide film between a sidewall of the recessed region and the lower portion of the contact plug; and
a metal layer on the metal silicide film and adjacent the contact plug,
wherein the metal silicide film is between the metal layer and the substrate,
wherein the metal layer comprises a same metal as the metal silicide film, wherein an uppermost surface of the metal layer is farther from the substrate than the uppermost surface of the source/drain region, and wherein the metal layer comprises a silicon content of 30 at % or less.

2. The semiconductor device of claim 1, further comprising a conductive barrier film that is between the contact plug and the metal silicide film, and that is between the contact plug and the metal layer.

3. The semiconductor device of claim 1, wherein a first thickness of the metal layer is smaller than a second thickness of the metal silicide film adjacent the metal layer.

4. The semiconductor device of claim 1, wherein the source/drain region is a first source/drain region, wherein the metal layer is a first metal layer, and wherein the first source/drain region is in a first region of the semiconductor device having a first conductivity type, the semiconductor device further comprising:

a second source/drain region in a second region of the semiconductor device, the second source/drain region having a second conductivity type that is different from the first conductivity type, wherein the second source/drain region comprises a second recessed region;

a second contact plug on the second source/drain region, wherein the second contact plug has a second lower portion within the second recessed region of the second source/drain region;

a second metal silicide film between a sidewall of the second recessed region and the second lower portion of the second contact plug; and a second metal layer on the second metal silicide film and adjacent the second contact plug, wherein an uppermost surface of the first metal layer is farther from the substrate than an uppermost surface of the second metal layer.

5. A semiconductor device, comprising:

a substrate comprising an active region;

an insulating layer on the substrate and comprising a contact hole that extends to the active region;

a contact plug in the contact hole and comprising a tip region in the active region;

a metal silicide film on the active region and adjacent the tip region of the contact plug;

a metal layer connected to an upper portion of the metal silicide film and on a side wall of the contact hole;

a conductive barrier film on a surface of the contact plug at an interface between the metal silicide film and the metal layer, wherein a lowermost portion of the conductive barrier film is closer to the substrate than a lowermost portion of the metal layer; and an intermediate silicide region between the metal layer and the metal silicide film and having a first metal content that is greater than a second metal content of the metal silicide film.

6. The semiconductor device of claim 1, further comprising:

an intermediate silicide region between the metal layer and the metal silicide film and having a first metal content that is greater than a second metal content of the metal silicide film.

7. The semiconductor device of claim 2, wherein a lowermost portion of the conductive barrier film is closer to the substrate than a lowermost portion of the metal layer.

* * * * *